United States Patent [19]

Gelzer

[11] Patent Number: 4,583,641
[45] Date of Patent: Apr. 22, 1986

[54] ARTICLE PACKAGING SYSTEM

[76] Inventor: John R. Gelzer, 2211 Lane Rd., Columbus, Ohio 43220

[21] Appl. No.: 652,579

[22] Filed: Sep. 20, 1984

[51] Int. Cl.$^4$ ............................................ B65D 73/02
[52] U.S. Cl. .................................... 206/330; 206/329; 206/461; 206/485
[58] Field of Search ............... 206/328, 329, 330, 331, 206/461, 485, 488, 820; 198/476, 654, 655

[56] References Cited

U.S. PATENT DOCUMENTS

| | | | |
|---|---|---|---|
| 3,129,814 | 4/1964 | Cheh et al. | 198/655 |
| 3,135,375 | 6/1964 | Henn et al. | 198/655 |
| 3,140,773 | 7/1964 | Cheh | 206/330 |
| 3,465,874 | 9/1969 | Hugle et al. | 198/655 |
| 3,605,062 | 9/1971 | Tinkelenberg | 206/331 |
| 3,746,157 | 7/1973 | I'Anson | 206/331 |
| 3,861,560 | 1/1975 | Entwistle et al. | 206/488 |
| 3,920,121 | 11/1975 | Miller | 206/330 |
| 4,069,916 | 1/1978 | Fowler et al. | 206/330 |
| 4,165,807 | 8/1979 | Yagi | 206/331 |
| 4,371,078 | 2/1983 | Hunt et al. | 206/331 |

Primary Examiner—Joseph Man-Fu Moy
Assistant Examiner—David T. Fidei
Attorney, Agent, or Firm—Robert E. Stebens

[57] ABSTRACT

An article packaging system is provided having a primary package which includes an elongated strip form carrier tape and bonding tape that are releasably secured together at longitudinally spaced points to package articles between the tapes' intermediate pairs of the points of interconnection of the two tapes. The carrier tape is provided with mechanisms for mechanically engaging with the articles to position the articles in fixed location to the carrier tape and in a predetermined orientation with respect thereto. A secondary packaging unit is provided in the article packaging system to receive and contain a length of the primary package in a spirally coiled configuration.

40 Claims, 23 Drawing Figures

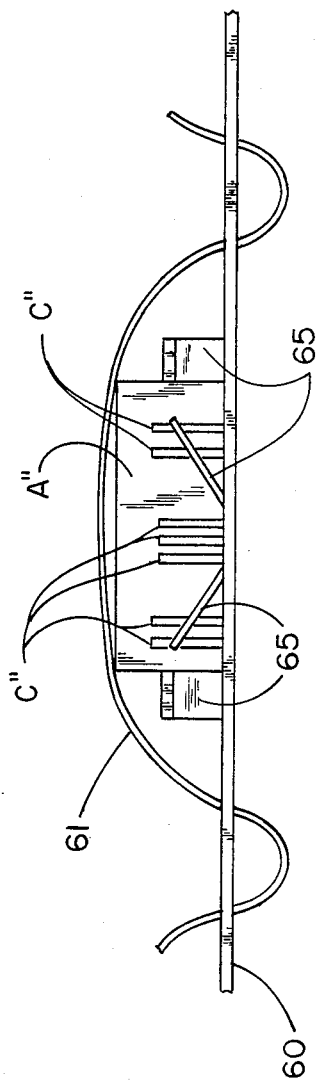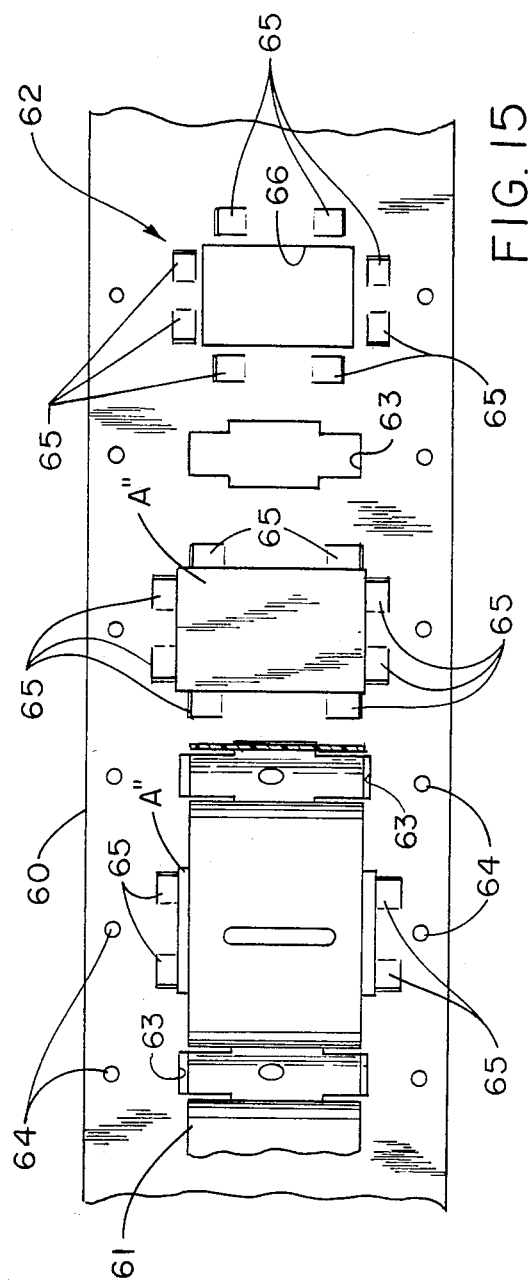

ARTICLE PACKAGING SYSTEM

FIELD OF THE INVENTION

This invention relates in general to article packaging and relates more specifically to packaging for relatively small sized articles such as electrical components or mechanical components. It relates more specifically to a packaging system that provides storage for such components and facilitates dispensing of the components at a work or use station as well as facilitating interim handling functions of those components. The invention relates in particular to an article packaging system that includes a carrier tape on which the articles to be stored, transported and dispensed are positioned in predetermined relationship to the carrier tape and are retained in association therewith by bonding means in the form of an elongated tape that is looped over the articles and is releasably secured to the carrier tape.

BACKGROUND OF THE INVENTION

Articles of manufacture, and particularly those of electronic circuit type, incorporate many diverse subcomponents which are inserted into other components or subassemblies or are interconnected by various means into electrical circuit systems. These electrical components upon fabrication require handling in the form of storage, transportation and ultimate dispensing at the use or work station where they are incorporated in the apparatus. Electrical components such as solid-state devices invariably have connecting electrodes which frequently are in the form of relatively short wires or pins or narrow electrical strips that have little structural strength and are readily subject to distortion and bending. These electrical contacts or electrodes are frequently designed to be disposed in predetermined relationship with respect to other electrodes in the normal multiple groups of electrodes so as to interfit into a circuit board socket or connecting position, but those electrodes may not necessarily have any fixed dimensional relationship to the physical structure of the body portion of the component. Examples of such electrical components are the integrated circuit chips, capacitors and electrical coils as well as numerous types of connectors and other components, either mechanical or electrical. Utilization of these components makes it essential that they be applied to the major circuit component or subassembly such that the electrodes form an electrical circuit with the circuit system of the component or subassembly. Because of the relatively fragile nature of these electrodes, handling of the components either in storage or interim testing functions and even at the ultimate use or work station may cause bending of one or more of the electrodes such that it is not precisely aligned or oriented with respect to the other electrodes. When this occurs, then the component is difficult to install and very frequently will be inadvertently installed such that there will be less than a complete electrical interconnection, thereby resulting in a defective assembly which may or may not be repairable. In those cases where the defective assembly is repairable, the repair will obviously necessitate further expense and time to place it in a usable condition and consequent increased production cost. If not repairable, then the entire assembly may, of necessity, require complete scrapping and thus result in increased production cost.

There are known attempts to package electrical components in a manner which will eliminate or substantially reduce the problem with respect to damage to electrical contacts or electrodes and to facilitate handling. These attempts have been partially induced to enable automation of systems for the dispensing of the components at work or use stations in their application to system assemblies. An example of such a system is the packaging of components such as the cylindrical rod-type electrical resistors or flat, disc shaped capacitors on elongated flexible tapes. Components such as these resistors are provided with two relatively long electrical leads which are oriented with respect to the component to extend in axially aligned but opposite directions. A number of such components are arranged in a series with their leads disposed in spaced parallel relationship. The terminal end portions of each of the two leads are secured to respective elongated strips of tape which, with the components, form a package. In utilization of components packaged in this manner, a component is gripped by its leads by a machine at the assembly station and the leads are cut to the desired length with the marginal end portions and tape being discarded. If necessary for a particular assembly, the leads remaining with the component may be bent or formed to specific configuration for assembly. Orientation of the lead is not a problem since the item is gripped by its leads and is thus in a proper orientation. While these tape systems have been found useful in automating assembly operations, these papar tape systems are limited in usefulness to items such as or similar to the resistor or capacitor elements which do not exhibit the problems of orientation and alignment of their electrode leads as is associated with the integrated circuit chips that are designed to be installed in printed circuit boards.

Automation in manufacturing has received initial motivation as a consequence of direct labor costs involved in the heretofore conventional assembly line type operations. While that labor cost remains significant, there are other factors that contribute to the total cost of a manufacturing or assembly operation. These other factors are packaging, storage and transport of the components, subcomponents, or even subassemblies, prior to their utilization at an assembly station. In many instances, there is a requirement for additional handling between the components' initial fabrication and packaging and ultimate utilization such as testing of components for functional operation. Failure to perform such testing prior to assembly with other components will result in defective products which results in inceased production costs regardless of whether a defective unit may be repairable. There is a further important factor in effecting automation of a manufacturing system and that is the inventory and scheduling of the components to an assembly station in coordination with other components to that same assembly line or operation. Economics of automation require computer control of a complete manufacturing system and component packaging thus plays an extremely important role in achieving the objectives of enabling components to be efficiently handled throughout an entire automated manufacturing system. The economics of the manufacturing process dictate that packaging of the components, or subassemblies, must be capable of automatic machine handling at all stages. Loading of components into a package, package storing and transport and delivery or dispensing of the components must be capable of being accomplished without manual operations to enable the computer controlled operations that are an economic necessity.

SUMMARY OF THE INVENTION

In accordance with this invention, an article packaging system is provided that is capable of accepting the articles such as electrical components with electrodes and to provide protection for those components subsequent to their fabrication in the course of storage, handling and in their utilization in a total manufacturing system susceptible to automated computer control. In addition to relatively simple configured components such as electrical resistors having only two leads, the packaging system of this invention is capable of handling components having a large number of electrodes and complex configurations such as the now widely used solid-state devices. The packaging system provided by this invention in an illustrative embodiment comprises an elongated carrier tape formed from a flat strip of material that is flexible to enable a length of the tape on which components are packaged to be wound or coiled for purposes of storage or to enable the carrier tape to be routed through a dispensing mechanism. Retention of the articles on the carrier tape at predetermined locations with a plurality of the articles being disposed in serially spaced relationship on the elongated carrier tape is effected by bonding means which, in the illustrative embodiment, also comprises an elongated flexible tape of strip form. The bonding tape and carrier tape are formed with cooperative means to releasably secure the bonding tape at predetermined intervals to the carrier tape with loops of the bonding tape extending in overlying relationship to the respective articles for protectively encapsulating and maintaining the articles in their predetermined positions on the carrier tape.

Positioning of the articles on the carrier tape at predetermined locations is effected by article locating means that is formed with or in the carrier tape or attached to the tape. The locating means may take the form of apertures that are dimensioned and configured to receive the pin or wire type electrodes of the components or other elements designed to cooperatively engage with a component or article in effecting the desired orientation. In order that the carrier tape will also function at a dispensing station in delivery of the components at a precise point with respect to the electrodes, the carrier tape is advantageously formed with indexing means that cooperate with the mechanism performing the actual dispensing function or which may perform other functions with respect to the components. This indexing may be in the form of perforations formed along marginal edge portions of the carrier tape to interengage with sprocket wheels of the dispensing mechanism and thereby effect orientation with the perforations being oriented in a predetermined relationship to the article locating means, for example, or by other types or forms of indexing means. With this arrangement, the carrier tape is enabled to deliver an article at a fixed location with the electrical leads being oriented in a precise predetermined relationship to that location regardless of the particular physical configuration and dimensional relationship of the component's body to those electrodes. This capability is extremely important where the assembly is effected by automated mechanisms such as computer controlled robotic devices.

In the specific illustrative embodiments of the invention, the carrier tape and bonding tape are formed with respective attachment means and connecting means to releasably interengage for retaining the articles in association with the the assembled tapes. In some of the illustrated embodiments, the attachment means formed in the carrier tape comprises apertures or sockets of a specific configuration that are designed to mechanically interengage with related configurations formed in the bonding tape. Additionally, the bonding tape is advantageously formed from a material exhibiting resilient characteristics such that the bonding tape will inherently function to secure itself in mechanically coupled engagement in the attachment sockets or apertures formed in the carrier tape, but readily permit detachment at the dispensing station where the components are to be removed for utilization. Other illustrative embodiments utilize releasable adhesives or other means to secure the tapes together.

A further feature of the specific illustrative embodiment is the capability of the bonding tape to perform a protective function in addition to the retaining function. Not only does the bonding tape retain the articles in association with the carrier tape, but it protects those components as to their body portion by effectively encapsulating the articles in cooperation with the carrier tape as well as functioning to protect the relatively fragile pin or rod-type electrodes.

The article packaging system of this invention is of particular utility because of its unique ability to enhance the storage, transport and utilization of the components that are so packaged and adaptability to machine automated, computer controlled operations at all stages. The carrier and bonding tape which constitute a primary package and are formed from flexible strips of material readily adapt to spiral coiling in a secondary packaging device. The secondary packaging device may be formed of paperboard of square configuration having predetermined dimensions to accept a length of the carrier and bonding tape assembled with a number of the articles in a spirally coiled configuration. Forming the secondary packaging device with a central aperture and providing of a coiling mandrel enables the length of the carrier tape to be spirally wound into the interior of the packaging device with the mandrel being removed when the device is filled. This system results in a relatively compact unit for storage and transport without the attendant weight of components such as the conventionally used arbor or reel on which a tape is wound. Once the carrier tape is wound into the interior of the secondary packaging device and the mandrel removed, the tape having a certain degree of resilience will expand in radially outward direction to contact the periphery of the secondary packaging unit and maintain itself in relatively fixed relationship thereto. Not only does the article packaging system of this invention provide for convenience in storage and transportation, but the system enables the tape-form primary package to be removed from the secondary packaging unit to permit testing or other interim processing of the components to assure that the components ultimately delivered to the dispensing point will be entirely functional and thereby further avoid having rejection of assemblies incorporating those components. At any interim testing or process stage, defective components can be removed and replaced or they may be merely removed to avoid having them installed in the assemblies. If further storage or transport is necessary prior to use, the elongated strip of packaged articles may be rewound into the secondary package.

Other specific embodiments of the elongated tape-form primary package may be provided in accordance with this invention. Some of these alternative embodiments include different locating means in the form of gripping tabs formed in the carrier tape and adapted to engage with the articles or components to effect location in precise location with respect to the carrier tape. Additional modifications of the locating means include auxiliary structures which may be formed in or attached to the carrier tape to support the respective articles in the desired location and to also provide enhanced physical protection for the components. These auxiliary structures may be in the form of nest-type fixtures that may be either integrally formed in the carrier tape or may be separately fabricated and then secured to the carrier tape. Regardless of their fabrication technique, the nest-type fixtures are constructed to perform the locating function and, if deemed necessary for the particular articles, provide physical protection for at least some portions of those articles.

These and other objects and advantages of the invention will be readily apparent from the following detailed description of illustrative embodiments of the invention and the accompanying drawings thereof.

DESCRIPTION OF THE DRAWING FIGURES

FIG. 1 is a fragmentary perspective view of a packaging system embodying this invention and including a carrier tape and bonding tape partially assembled with components.

FIG. 2 has a plan view of the carrier tape.

FIG. 14 is a fragmentary side elevational view on an enlarged scale of the primary package shown in FIG. 13.

FIG. 15 is a plan view of the carrier tape shown in FIG. 13 with articles disposed in cooperative engagement with some of the locating means.

DESCRIPTION OF THE ILLUSTRATIVE EMBODIMENT

Figure 1:
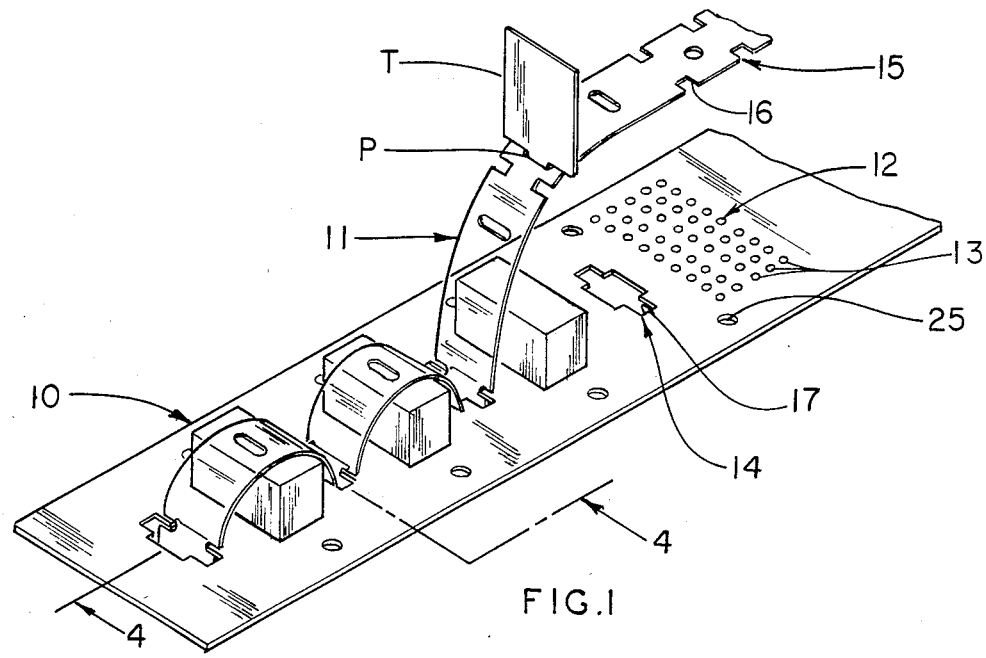
Figure 4:
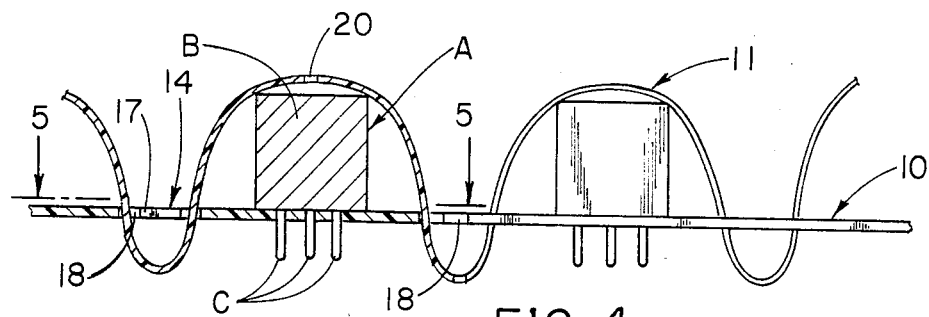
FIG. 4 is a fragmentary sectional view on an enlarged scale taken along line 4—4 of FIG. 1.
Figure 5:
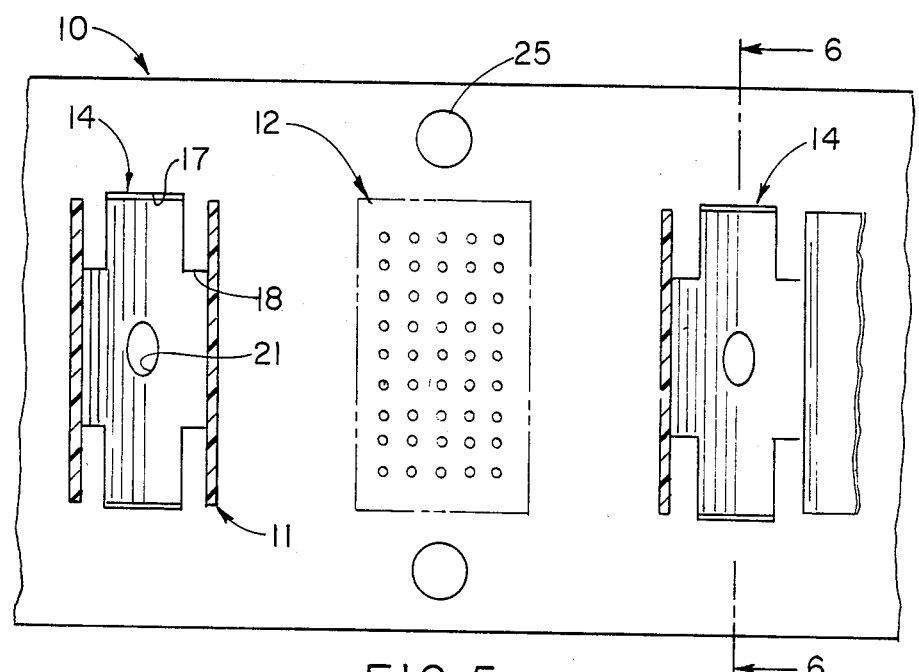
FIG. 5 is a fragmentary sectional view on an enlarged scale taken along line 5—5 of FIG. 4.
Figure 6:
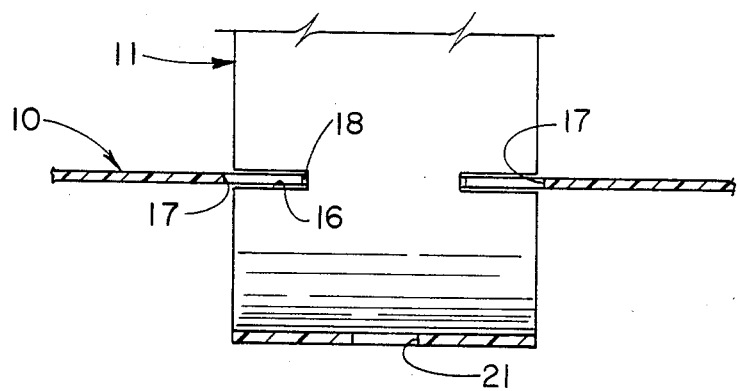
FIG. 6 is a sectional view taken along line 6—6 of FIG. 5.

Referring to FIG. 1, an article packaging system which comprises a primary package embodying this invention is shown in fragmentary perspective view with portions of the respective elements thereof shown as separate prior to assembly into packaging relationship to a series of articles which are designated by the letter A. These articles are diagrammatic representations of components such as electrical components, but without reference to any specific dimension or component configuration. These components are representative of articles that may be packaged by the packaging systems provided in accordance with this invention and the components depicted as exemplary are typical solid-state devices. Thus, each of the articles A is merely represented as comprising a component body B of rectangularly shaped, block-form configuration and provided with a plurality of electrically conductive connector pins or electrodes C which can be best seen in other figures of the drawings such as FIG. 4. Furthermore, for purposes of example the articles may be provided with a number of the connector pins C arranged in a plurality of rows arranged in parallel relationship and extending parallel to the long dimension of the illustrative component. While the subsequent description of this specific embodiment of the article packaging system is described with reference to an article of this particular configuration and construction, it is to be understood that this description is for purposes of example and that the packaging system may be adapted to function with articles of different configuration and also for purpose of packaging articles other than electrical system components.

The primary package of this basic embodiment of the article packaging system includes only two components and these are described as a carrier tape 10 and article bonding means in the form of an article bonding tape 11. The carrier tape 10 is formed from a flat strip of material that is relatively thin and which exhibits a requisite degree of flexibility to permit its functioning in the intended manner for secondary packaging and feeding through various types of mechanisms, particularly automated dispensing mechanisms, as will be described in further detail. It is advantageous to use materials for forming of the carrier strip that are either sufficiently low in cost as to economically permit disposal once the packaging system has performed its function or which can be recycled or even reused in forming of further packaging. In the exemplary embodiment, the carrier tape is formed from a suitable synthetic resin or plastic material which in the illustrative configuration will provide adequate structural strength for support of the components and interengagement with the bonding tape as well as cooperative functioning with various utilization or handling mechanisms or machines.

Figure 2:
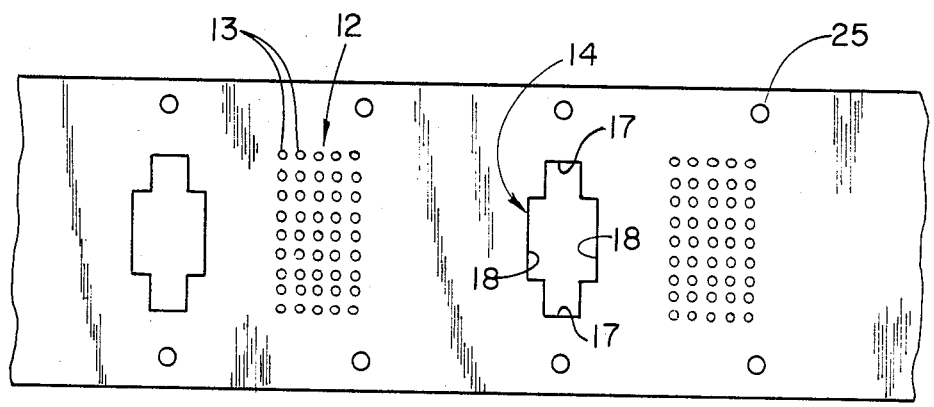

To perform the function of positioning the articles on the carrier tape 10, the tape is formed with serially spaced article locating means 12 which, in the illustrative embodiment, comprise a plurality of apertures 13 that are dimensioned and relatively disposed to receive the connector pins of the article A with those pins thus projecting through the carrier tape. If desired, the carrier tape 10 may be designed with a plurality of the apertures 13 as shown in FIG. 2 in a predetermined grid pattern such that the tape will be adaptable to a number of such articles through each of the different types of articles may have different arrangements and numbers of the connector pins. Also, forming of a grid type pattern of the apertures 13 enables any particular article to be located at a desired relative position with respect to both the longitudinal axis of the carrier tape and its transverse axis. It will also be understood that the article locating means 12 as is specifically illustrated is for purposes of illustration and the locating means may be modified in accordance with the requirements for a particular article destined to be packaged in an article packaging system embodying this invention and modifications thereof are illustrated in the drawings and are described hereinafter.

The article bonding tape 11 is also advantageously formed from a low cost material such as a synthetic resin or plastic to economically permit disposal or can be formed from a material which is adapted to be recycled. In the illustrative embodiment, the bonding tape is formed from a plastic material and comprises an elongated strip of the material which is relatively thin to permit its flexing, thereby enabling interengagement with the carrier tape 10 and conforming to the body B of the articles in effecting retention of the articles on the carrier tape. The width of the bonding tape 11 is determined in part by the particular article A which is to be packaged and, to enable performance of the protective function, is of a width which can be equal to or greater than the dimension of the article in transverse relationship to the carrier.

It will be understood that the widths of the carrier tape 10 and bonding tape 11 are determined in the first instance by the articles which are to be packaged. However, it is contemplated that the packaging system will be fabricated in several standardized width sizes that are accommodated by the various automated machines or mechanisms with which the system may be utilized. By way of example, the carrier tape may be provided in 1, 2, 3, 4 and 6 inch widths (2.54, 5.08, 7.62, 10.16 and 15.24 centimeter widths).

Releasable interengagement of the bonding tape 11 with the carrier tape 10 is effected by interengaging means including cooperating attachment means 14 formed in the carrier tape and connecting means 15 formed with the bonding tape. Attachment means 14 comprises an aperture formed in the carrier tape and of predetermined configuration which will mechanically couple with the connecting means 15 which comprises sets of notches 16 formed in marginal edge portions of the bonding tape. These notches 16 have a width greater than the thickness of the carrier tape so as to receive the carrier tape. The attachment means apertures 14 are formed intermediate each article locating means 12 at the approximate midpoint therebetween and in longitudinally aligned relationship to the locating means. Each of the attachment means apertures 14 is of a generally rectangular configuration having a central transversely extending section terminating in longitudinally extending end edges 17 that are spaced apart a distance sufficiently greater than the maximum width of the bonding tape 11 to permit the bonding tape to be inserted through this portion of the aperture. Formed at each of the opposite transversely extending sides of this central portion of the aperture are respective longitudinally projecting notches 18. Each of the notches 18 which opens to the central portion is centered transversely to the central portion and is of a substantially lesser transverse width than the width of the bonding tape. The depth of each of the notches 18 is of the order of the thickness of the bonding tape 11 and is advantageously slightly greater to better assure maintenance of the interengagement.

The pairs of the notches 16 formed in the bonding tape 11 and cooperatively forming the connecting means 15 are longitudinally spaced a distance apart along each marginal edge and extend inwardly a distance such that the dimension between opposed inner end edges 19 of the notches will be slightly less than the transverse dimension of the notches 18 of the aperture 14. This configuration of the attachment and connecting means 14, 15 provides a mechanical interlock which is effected by folding the bonding tape 11 into a loop centered on the notches 16 and projecting that loop through the attachment means aperture 14 in a manner as can be best seen in FIG. 4. With the bonding tape 11 projected through the aperture, the bonding tape which is advantageously formed from a material having a characteristic resilience, will tend to cause adjacent portions of the loop to diverge and to cooperatively displace those portions longitudinally of the carrier tape and result in the notches 16 of the bonding tape interfitting with the notches 18 of the carrier tape. When thus interlocked, the bonding tape 11 is mechanically secured as a result of the notches 16 projecting transversely across the adjacent portions of the carrier tape at each transverse side of the carrier tape notches 18. During assembly, it will be noted that the bonding tape 11 is looped with a relatively small curvature such that the spacing of the adjacent portion of the bonding tape will be compressed to an extent to be inserted through the central portion of the aperture 14 which has the greatest transverse dimension. Once the bonding tape has been projected a sufficient distance through the aperture such that the notches 16 in the bonding tape will align with the plane of the carrier tape, then release of any compressing force will permit the portions of the bonding tape 11 projecting through the aperture 14 to diverge and extend into the notches 18 for interlocking therewith.

Retention of the articles A in their respective article locating means 12 is effected by the length of the bonding tape 11 which extends over those articles from between the two points of interconnection with the carrier tape as by the attachment and connecting means 14, 15. Thus, by appropriately spacing the sets of notches 16 forming the connecting means 15, it is possible to cause the intervening length of the bonding tape 11 to extend in relatively close conformity to exterior surface portions or points on the articles A. For a specific article having particular dimensions, it is therefore possible to configure the bonding tape so that it will contactingly engage with respective articles and secure the articles to the carrier tape. Design of a carrier tape and bonding tape is thus determined in part by the dimensions of the articles A such that the carrier tape 10 may be provided with the article locating means and the attachment apertures 14 whereby an appropriately dimensioned and constructed bonding tape 11 may be utilized for any specific article.

A further aspect of design and construction of the bonding tape 11 is the resiliency of that tape and its ability to conform to the particular articles. To assure good retention and interlocking as between the bonding tape and the carrier tape, it is advantageous to construct the tape so that it will have a greater resilient force in the region of the loop that interlocks in the aperture 14 as compared to that portion which overlies the article. In view of the formation of a double pair of notches 16 in the region of the loop that is inserted through the attachment aperture 14, this portion of the bonding tape 11 that is looped and projected through the aperture will thus be capable of exerting a lesser of a resilient force as compared to that portion of the tape that extends over the articles. To compensate for this decrease in resilient force that can be achieved in the interconnecting portion of the tape, it is advantageous to form an elongated slot 20 in that portion of the bonding tape overlying the article and at the approximate midpoint between the attachment points. This elongated slot effectively reduces the resilient force that can be generated by the intervening length of the bonding tape and thus the looped portion of the tape projected through the aperture 14 will be capable of exerting sufficient force to maintain itself in interlocked relationship therewith. This difference in resilient effect is of greater consequence where the articles A are of relatively small configuration and the length of the bonding tape looped over the articles will be comparable to that of the interlocking loop portion. In the case of larger articles where the loop extending over the article is relatively large, the resilient force will be substantially lessened as compared to that of the interlocking loop portion. In this latter case, it may not be as important or even necessary to form the elongated slot in the bonding tape.

Figure 3:
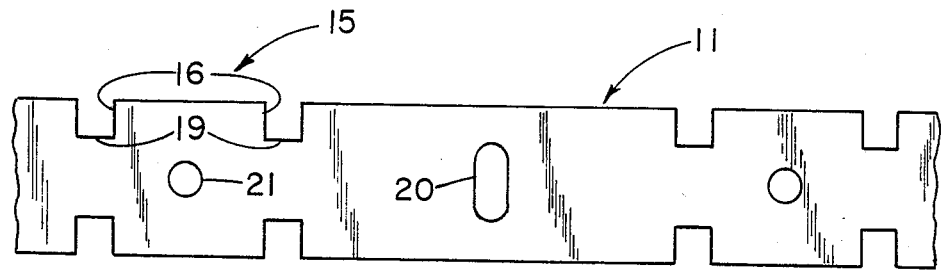
FIG. 3 is a plan view of the bonding tape.

Assembly of the bonding tape 11 with the carrier tape 10 can be accomplished by relatively simple technique. Articles A will first be placed on the carrier tape with their respective connector pins inserted into the article locating means 12 and thus fixed in position on the surface of the carrier tape. Once this has been accomplished, the bonding tape 11 may then be applied in a sequential manner by looping the tape over the articles and then subsequently forming the interlocking loop and inserting that loop through the aperture 14. While this assembly may be relatively difficult if attempted only by means of manually attempting to fold and loop the tape, assembly is made relatively simple when an insertion tool is utilized. By way of example, an insertion tool T is illustrated in FIG. 1 and is seen as comprising a flat rigid plate which is formed with an axially projecting pin P at its lower end. For purposes of illustration, the insertion tool T may be held in a person's hand and the pin P then inserted into a circular aperture 21 formed in the bonding tape 11. This circular aperture 21 is formed centrally between the longitudinal edges of the tape and symmetrically located between the notches 16 as can be best seen in FIG. 3. Thus, with a simple downward projection of the insertion tool in substantial vertical alignment with the aperture 14, the tool will be effective by a simple downward motion in the direction of the carrier tape to concurrently form an interconnecting loop in the bonding tape as well as causing the adjacent portion of the tape at one side to form into overlying relationship to that underlying article. The tool is of a width such that it may also pass through the aperture in projecting the formed loop into the aperture to a position where the portions of the tape forming the loop may diverge with the notches 16 then becoming interlocked with the notches 18 in the carrier tape. Disassembly of the bonding tape from the carrier tape can be effected by a simple movement of pulling the bonding tape in a reverse relationship to itself such that it will be removed from interlocking relationship at one side of the aperture and will then, as it is pulled up, cause the opposite side to move out of the other notch 18 as a consequence of its resilience.

This described and illustrated technique of assembling the bonding tape 11 with the carrier tape 10 is deemed exemplary. It is contemplated that other apparatus incorporated in automated machines may also be provided to effect assembly of the tapes and packaging of articles.

In dimensionally configuring the bonding tape 11, it is advantageous to not only form the notches 16 in each respective pair of notches a distance apart sufficient to achieve the resilient interlocking force, but to also result in the formation of an interlocking loop that will project a predetermined distance outwardly from the opposite or underside of the carrier tape 10. Preferably, this interlocking loop will have a projecting depth which is greater than that of the connector pins C. As a consequence, the interlocking loops of the bonding tape will provide protection to those connector pins C as against their contact with other structures or components which could cause deformation of the pins. In effect, the interlocking loops form a support base for the packaging system.

To further enhance the usefulness and capabilities of the article packaging system embodying this invention, it is advantageous to provide the system with an indexing means. To provide positive control over its operation, such indexing means is conveniently provided through formation of a series of longitudinally spaced indexing apertures 25 which, if desired, may be formed along each marginal edge of the carrier tape 10. These indexing apertures are designed to interfit with sprocket wheels or other devices having projections to engage with the apertures 25 (not shown) of either the mechanisms for assembly of the packaging system with articles or the dispensing of those articles from the packaging or any other mechanism operating with the packaging system. These indexing apertures 25 are located in the carrier tape such that they will be oriented in specific dimensional relationship to the article locating means 12. Thus, it is possible through such indexing apertures to either precisely locate the carrier tape 10 at an article loading station or precisely locate the carrier tape at an article dispensing station. With the indexing apertures 25 located in predetermined relationship with respect to the article locating means 12, there is assurance that other mechanisms will be capable of positioning the articles in the locating means or to remove them from that position for subsequent use in automated systems. In using the tape indexing means in conjunction with the loading of the articles, it will be noted that the carrier tape 10 may thus be positively fixed during those sequential operations wherein an apparatus may mechanically load components onto the carrier tape and an insertion tool T which may be incorporated in a mechanical device can automatically perform assembly of the bonding and carrier tapes. Although indexing apertures 25 are illustrated, it will be understood that other indexing means and apparatus may be utilized.

Figure 7:
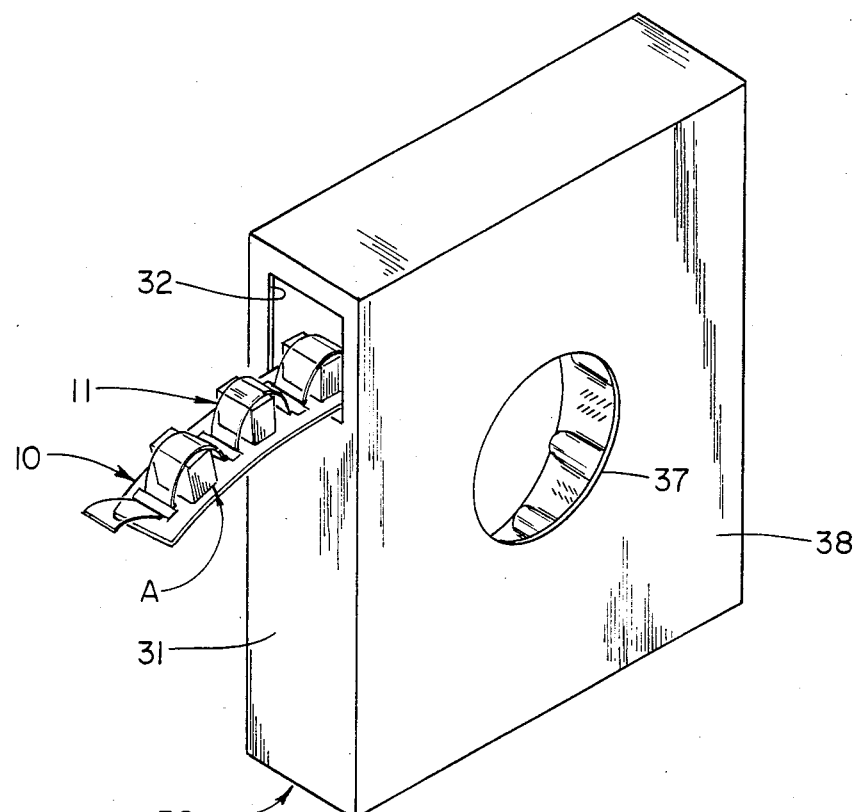
FIG. 7 is a perspective view of a secondary packaging device in which a length of the primary package comprising a carrier tape with tape bonded articles is disposed.
Figure 8:
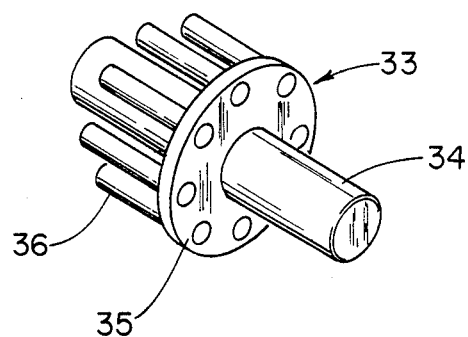
FIG. 8 is a perspective view of a coiling mandrel utilized for coiling the primary package within the secondary packaging unit.
Figure 9:
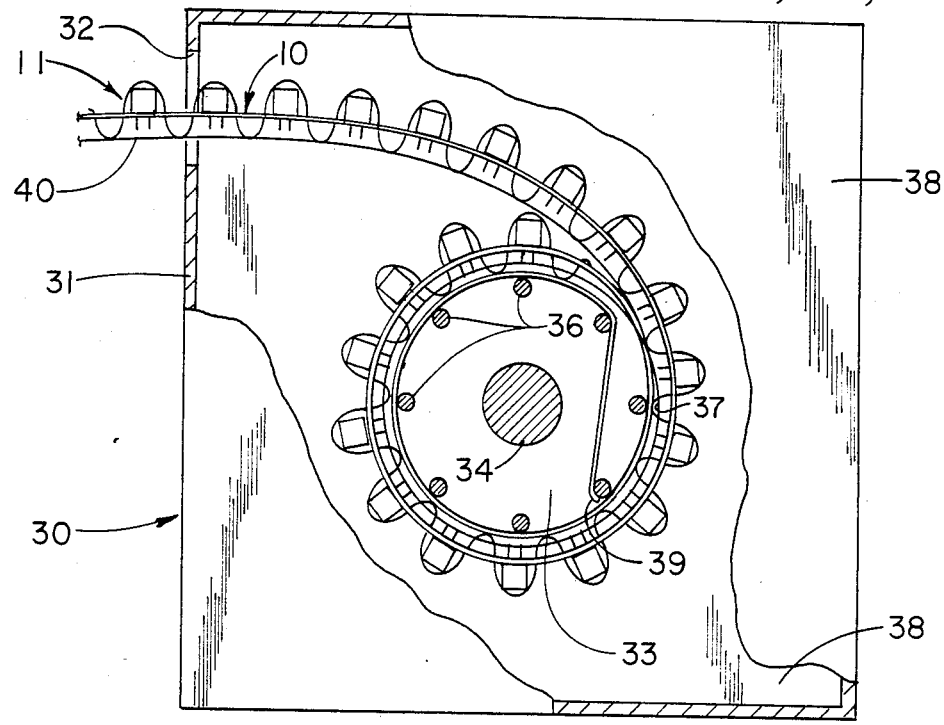
FIG. 9 is an elevational view of the secondary packaging unit with portions of the front side wall thereof broken away for clarity of illustration of the tape-form primary package coiling mandrel during the course of a coiling operation.
Figure 10:
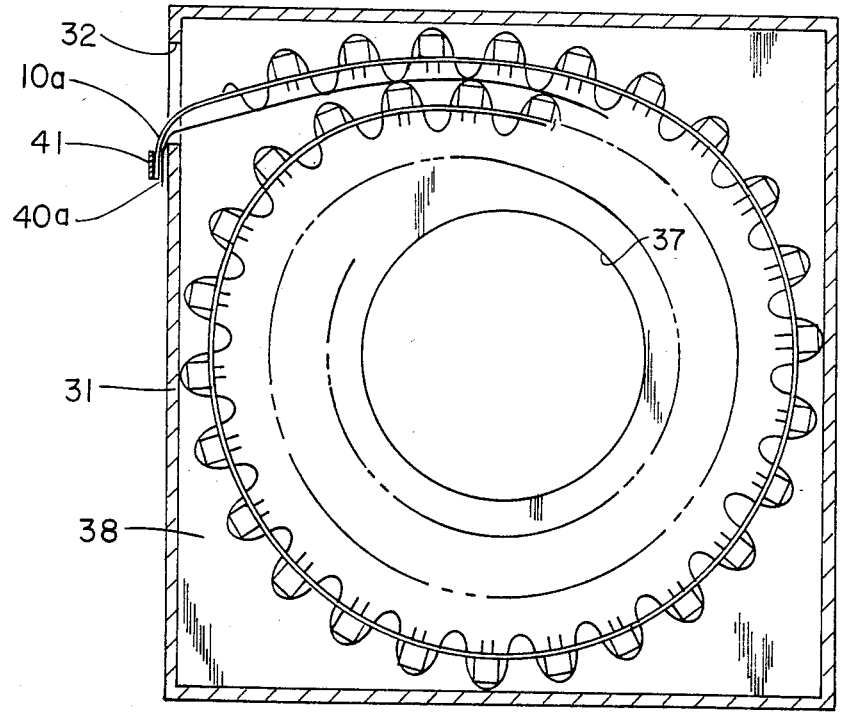
FIG. 10 is an elevational view of the secondary packaging unit with the front side wall thereof broken away for clarity in illustrating the coiled packaging system when released from the coiling mandrel.

While the primary package comprising the carrier and bonding tapes 10 and 11 assembled in association with the respective articles A is of substantial use in and of itself, it is advantageous to combine that primary packaging with a secondary packaging unit 30. Such a unit is illustrated in FIGS. 7, 9 and 10 and in a basic form comprises a square configured box that is dimensioned to receive a predetermined length of the primary packaging in spirally coiled relationship. This secondary packaging unit 30 which may be fabricated from paperboard or other suitable materials, is formed with its one edge wall 31 provided with an opening through which the primary package may enter and exit. To effect the spiraling or coiling of the primary package in the secondary package, a mechanism comprising a coiling mandrel 33 is provided for use with automated mechanisms in effecting the concepts and objectives of this invention. Such a coiling mandrel 33 as is shown in FIG. 8 in its basic form comprises a support spindle 34 provided at one end with a circular plate 35 which carries a plurality of axially projecting coiling pins. These coiling pins 36 are arranged in a circular pattern and project axially from one face of the plate 35 which, in the illustrative embodiment, is opposite to that of the support spindle. The secondary packaging unit 30 is formed with a circular aperture 37 that is centrally located in one or both of the side walls 38 and is of a size to permit insertion of at least the coiling pins 36 of the mandrel 33. With the coiling mandrel 33 thus positioned, the primary packaging strip, when inserted a sufficient distance through the opening 32 will be caused to come into engagement with the coiling pins and interfit therewith to become mechanically engaged. Preferably, a marginal end portion of the primary package comprises only the carrier tape 10 to facilitate its becoming interconnected with the mandrel 33 and avoid having the components or articles A being placed in a position to be damaged or interfere with engagement with the mandrel. It is also advantageous to form the terminal end portion of the carrier tape that is engaged with the coiling mandrel with a lip or flange 39 that will hook over one of the coiling pins. Rotating the coiling mandrel 33 will then coil the primary package into a spiral or coil in a manner as is illustrated in FIG. 9.

When a predetermined length of the primary package has been drawn into the secondary package, the operation is terminated and the primary package severed. At this time, the coiling mandrel may then be withdrawn from the secondary package and thereby remove the coiling pins 36 from engagement with the primary package. Upon removal of the coiling mandrel, the coiling force will be removed and as a consequence of resilience of the primary package, the length of the primary package will expand or partially uncoil to the extent that it can do so due to the physical interior confining surfaces of the secondary package. This uncoiling is diagrammatically illustrated in FIG. 10 and has the advantage that the primary package will then be essentially fixed in position in the interior of the package. It will be noted that this resilience of the primary package may be obtained from the bonding tape 11 of from the carrier tape 10 which may also be formed from a material that exhibits a degree of resilience.

The loops formed in the bonding tape 11 at opposite sides of the carrier tape 10 perform a protective function with respect to the packaged articles as has been described. This protection is generally adequate when the primary package is coiled as shown in FIGS. 9 and 10 as the random points of contact between adjacent spirals will result in some of the loops of the bonding tape 11 projecting from one side contacting some of the loops projecting from the opposite of an adjacent coil. Although there may be instances of some of the loops in any one coil contacting the connecting pins C of some of the articles A, the number of such contacts will be minimal and the contacting force will also be relatively smaller than the contacting force between contacting loops. Where even such minimal contact and reduced contact force is unacceptable as to particular articles, a barrier strip 40 may be provided. A barrier strip 40 formed from a flexible material which may be either hard (i.e., substantially incompressible) or soft (i.e., resiliently compressible) can be spirally wound with the primary package as shown in FIGS. 9 and 10 in interleaved relationship and will thus limit contact to only the loops of the bonding tape 11. The terminal end portion 10a of the carrier tape of the primary package that may extend out of the secondary package 30 through the opening 32 may be secured to the edge wall 31 as by a strip of adhesive tape 41 to assure that the primary package will not inadvertently unreel out of the secondary package. The terminal end portion 40a of the barrier strip 40 may also be similarly secured to the secondary package.

The embodiment of the primary package illustrated in FIGS. 1–6 and previously described in detail is of a symmetrical construction and shown as functioning with uniformly sized articles. As such, the carrier tape 10 is formed with uniformly spaced attachment apertures 14 that function for attaching of the bonding tape 12 and having locating means 12 that are also uniformly spaced and disposed intermediate adjacent pairs of the attachment apertures for location of the articles A. Similarly, the bonding tape 11 is formed with its notches 16 that form the connecting means 14 disposed in uniformly spaced relationship and at the spacing necessary for accommodating a particular sized article. Accordingly, for a different sized article than that which is illustrated in FIG. 1, it may be necessary to provide a bonding tape wherein the notches 16 are at a greater or lesser spacing than that which is illustrated. The difference in spacing will be dictated by the particular size of the article such that the bonding tape will be effective in performing its bonding function and securely hold the article on the carrier tape. Depending upon the size of the articles A with which the carrier tape is to function, it may also be necessary to modify the spacing of the locating means 12 for those articles as well as modifying the distance or spacing for the attachment apertures 14. Such modifications in the spacing of the attachment apertures, as well as the locating means 12 may also necessitate a correlated modification in the spacing of the notches 16 formed in the bonding tape. It will also be understood that the width of the carrier tape 10 and bonding tape 11 is also determined by the size of the articles A with which it is to function. It is contemplated that the carrier tape 10 and bonding tape will be fabricated in a number of standard sizes as to width as previously described such that they will collectively accommodate a wide range of articles with which such a packaging system will function. Also, since the bonding tape 11 functions to provide protection for the articles, it is advantageously of a width that is comparable to the dimension of the articles A in a transverse direction relative to the carrier tape. The dimension of the article in a transverse direction to the carrier tape for convenience is referred to as being the articles' transverse dimension. However, the width of the bonding tape may be relatively larger than the transverse dimension of the articles or, in cases where protection is not an essential criteria, that tape may be of a lesser width than the transverse dimension of the articles.

Figure 11:
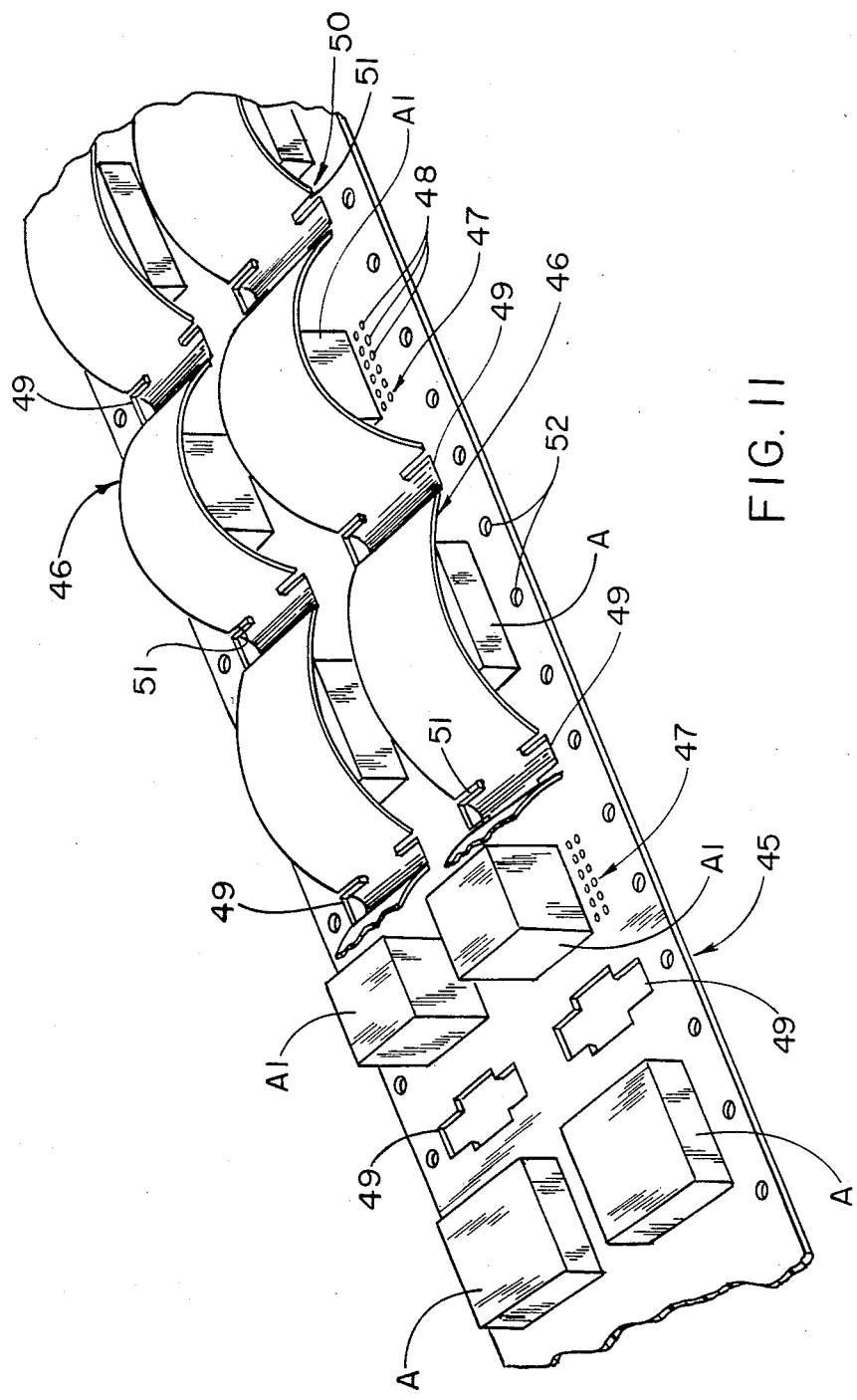
FIG. 11 is a perspective view of a portion of a modified primary package embodying the invention wherein the carrier tape is designed to carry articles in a plurality of parallel rows extending longitudinally of the tape.

An article packaging system constructed in accordance with this invention also need not be limited to a single longitudinal row of articles as is illustrated in the embodiment shown in FIG. 1. It is possible to construct the packaging system such that a plurality of longitudinal rows of the articles may be positioned on a carrier tape. This modification is illustrated in FIG. 11 and includes a carrier tape 45 designed to carry the articles A and A' arranged into two spaced parallel, longitudinally extending rows. To secure the articles to the carrier tape, two bonding tapes 46 are provided with each bonding tape extending longitudinally of a respective row of the articles and cooperating with the carrier tape to secure those articles in packaged relationship. Specifics of construction of the carrier tape 45 and bonding tapes 46 is essentially that described in detail with respect to the embodiment of FIG. 1. Thus, it will be seen that the carrier tape 45 in FIG. 11 is also provided with article locating means 47 such as a number of small apertures 48 formed in a grid pattern and attachment apertures 49 disposed adjacent to and at opposite sides of each locating means 48. The bonding tapes 46 are also formed with connecting means 50 in a form of pairs of notches 51 that are adapted to mechanically interlock in releasable engagement with the respective attachment apertures 49, in the same manner as previously described with the FIG. 1 embodiment. The carrier tape 45 is also provided with indexing means in the form of two longitudinally extending rows of apertures 52 designed to cooperate with mechanisms to assure that the carrier tape will be precisely positioned at a predetermined point with respect to the articles that are packaged with the tapes. It will be noted that the locating means 47 for the articles in each of the two longitudinal rows are oriented in transversely aligned pairs to simplify the utilization of this packaging system. It will also be noted in this illustrated embodiment of a modified packaging system that it is designed for packaging of at least two different sized articles A and A'. These articles A are illustrated as being different in all three dimensions and the two different articles are alternatively positioned along the carrier tape. Such a packaging system may be readily utilized in computer controlled equipment which is readily adapted to accommodate different sized articles received in a predetermined sequence. While only two different sized articles are shown in this embodiment, it will be understood that more than two different sizes may be packaged on a single carrier tape and that this concept of packaging different sized articles is equally adaptable to the embodiment as shown in FIG. 1. Also, a packaging system may include more than two rows of the articles. It will also be understood that a single bonding tape may be used in place of two bonding tapes where the articles in each transverse row are of the same dimensions.

Figure 12:
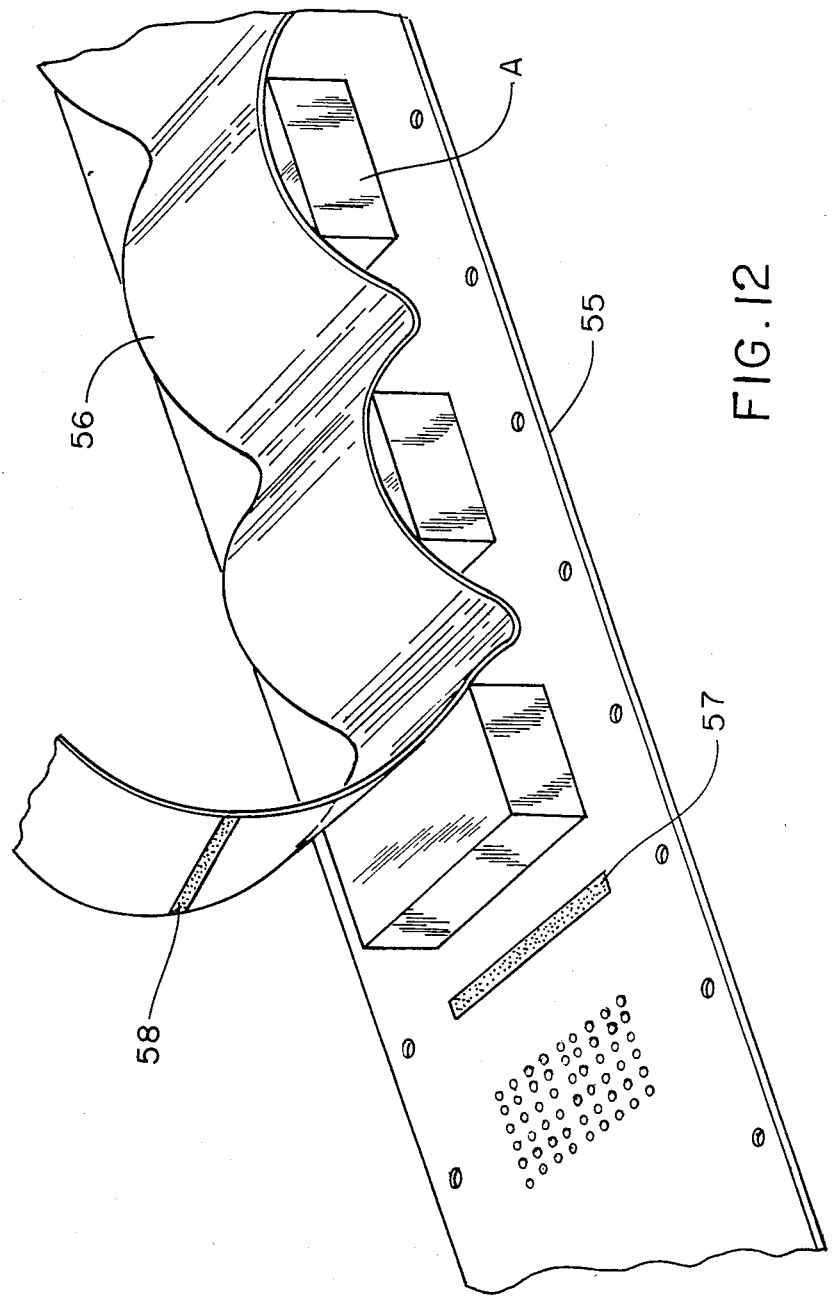
FIG. 12 is a perspective view of a portion of a modified primary package embodying this invention wherein the bonding tape is secured to the carrier tape by modified attachment means.

Another modified packaging system embodying this invention is shown in FIG. 12. This modified packaging system also includes a carrier tape 55 and a bonding page 56 which cooperatively interengage to secure a number of articles in longitudinally aligned relationship so as to form the package for those articles. In this embodiment, however, the two tapes are secured by interengagement means other than a mechanical type interconnection. In this embodiment, the interconnection is effected by adhesive bonding which is in the form of a strip of adhesive material 57 extending transversely of the carrier tape and formed on the surface thereof at spaced intervals which coincide with the loops of the bonding tape 56 at points intermediate the locations of the articles and article locating means 12. If appropriate for a specific adhesive used with tapes fabricated of particular materials, the adhesive may be applied to surfaces of both tapes prior to interengagement as is shown in FIG. 12 with a second strip 58 applied to the bonding tape. With this type of construction, the adhesive material is advantageously of a type which, while capable of forming a sufficiently strong mechanical bond between the two tapes as to maintain the articles in packaged relationship, the bond is not so great that the tapes cannot be subsequently separated as at a dispensing station by application of sufficient force and pulling the bonding tape off from the carrier tape. Bonding of the tapes may also be effected by other than adhesive materials, such as for example, the well known loop and hook type of fabric fasteners having the components attached to the respective surfaces of the carrier and bonding tapes 55 and 56. Also, it is possible to utilize a heat sealing technique as is conventional with many types of plastic materials.

Figure 13:
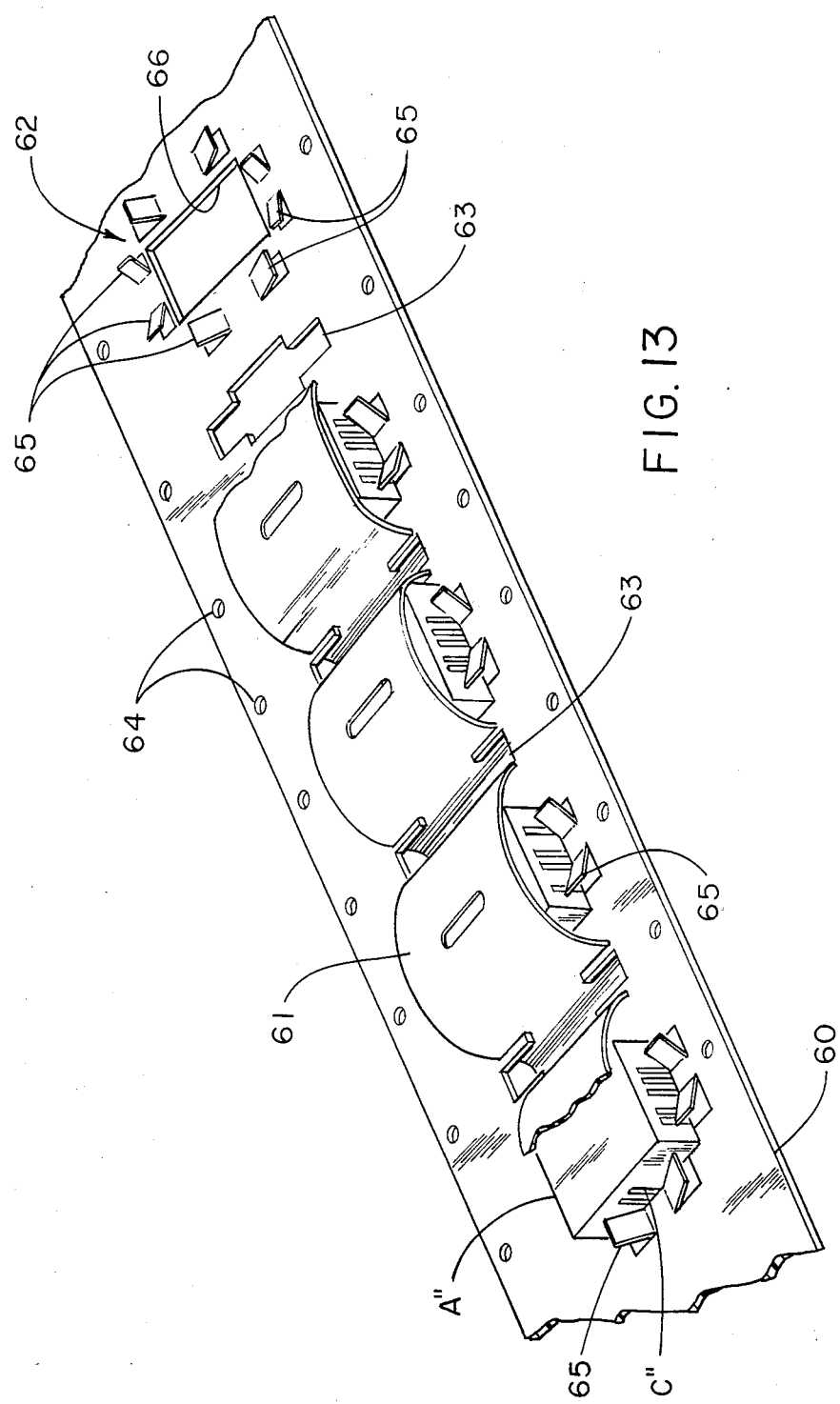
FIG. 13 is a perspective view of a portion of a modified primary package embodying this invention wherein the carrier tape is formed with locating means adapted to fix articles that are not provided with projecting electrodes in a predetermined location.

A further modified construction of a packaging system embodying this invention is illustrated in FIGS. 13, 14 and 15. This modified packaging system includes a carrier tape 60 and a bonding tape 61 that are of the same construction and function in a manner similar to that described with respect to the FIG. 1 embodiment. As such, the carrier tape 60 is provided with article locating means 62 and attachment apertures 63 that are disposed at opposite sides of each locating means. Also, the carrier tape is provided with a series of longitudinally spaced indexing apertures 64 along each longitudinal edge portion. This modified packaging system is designed for utilization with articles A" which are not provided with a number of pin-type electrodes such as the articles A described with respect to the FIG. 1 embodiment and which can cooperate with locating means in the form of a number of cooperating apertures formed in the carrier tape. In this embodiment, the system is designed to package articles A″ which are illustrated for simplicity of description as merely being rectangularly shaped blocks. These illustrative articles A″ are diagrammatically representative of electrical components that are provided with electrical contacts C″ in the nature of flat surfaced electrodes. These electrodes or contacts C″ may be formed on one or more sides of the articles, and for purposes of illustration, are shown formed on two sides of each of the articles A″. These electrodes may also extend onto the bottom surface of the article. While electrical components are specifically illustrated and described as the aticles with which the several embodiments of this invention are intended to be utilized, it will be understood that non-electrical articles may be advantageously packaged by the packaging system of this invention. Even in electrical assemblies, there frequently are non-electrical components which are readily adaptable to automated assembly operations and which can be advantageously packaged by the packaging systems of this invention.

The locating means 62 for the articles A″ of this type are formed as small tabs 65 that are integrally formed in the carrier tape 60 shown in FIGS. 13–16. Eight of these tabs 65 form each locating means in this illustrative embodiment and they are arranged in a rectangular pattern dimensioned to accommodate the specific sized article A″. Two pairs of the tabs 65 are thus arranged to extend in a transverse direction with respect to the carrier tape and engage the sides of the article while the other four tabs are arranged in pairs to engage opposite transverse ends of the article. Each of the tabs 65 is formed in the carrier tape such that they can be pushed upwardly about a respective hinge line to extend in upstanding relationship to the surface of the carrier tape. These tabs 65 are dimensionally located so that when in upstanding relationship to the carrier tape, the article may be positioned between the opposed sets of the tabs. The edges of the tabs will engage in secure frictional gripping relationship to the side and end wall surfaces of the article A″ to provide a positive and accurate locating of the article. With the articles A″ thus located in the respective locating means 62, the bonding tape 61 may be assembled as described with respect to the FIG. 1 embodiment of this invention.

It is also an objective of this invention to provide packaging systems which are adaptable to automated testing of electrical components. With the previously described embodiments of this invention, the electrodes projected through the carrier tape and were thus readily accessible for inteconnection into testing apparatus circuitry. In the case of the packaging system of FIGS. 13, 14 and 15, access to the contacts C″ for testing may be provided in the form of a window 66 formed in the carrier tape 60. This window 66 is of a size and configuration to expose the contacts C″ formed on the bottom of the article A″ to a sufficient extent to enable interconnection with test apparatus (not shown).

Each of the embodiments previously described in conjunction with the respective drawing figures, other than that of FIG. 12, is designed in a manner such that the bonding tape is assembled with the carrier tape to provide protection for the articles that have electrodes and which project through the carrier tape. Electronic components of specific types are sometimes of a construction wherein the electrodes are so fragile that the previously described tapes are not deemed fully sufficient to provide the necessary protection. Some of these electrical components not only have extremely fragile electrodes such that additional protection must be provided against mechanical damage as a consequence of physical contact with other objects, but it is sometimes necessary to also provide electrical shielding for the electrodes of those components that may be highly susceptible to electrical damage through inadvertent application of an electrical voltage to one or more of the contacts. Such electrical damage can occur as a consequence of static electricity that may build up in the apparatus in which the components are processed and utilized and may be inadvertently applied to the components through their electrodes.

Figure 16:
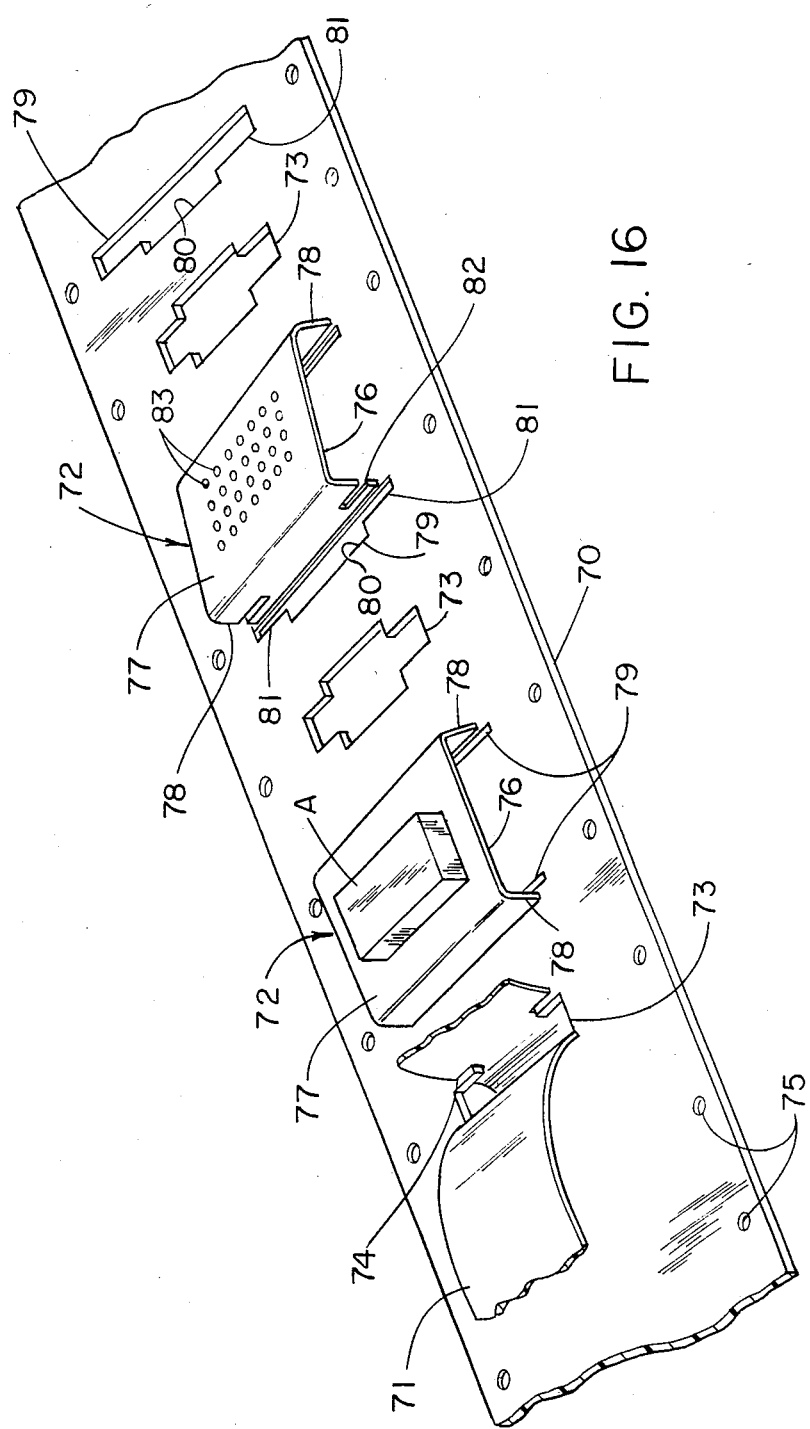
FIG. 16 is a perspective view of a portion of a modified primary package wherein the carrier tape is provided with nesting fixtures for the articles.
Figure 17:
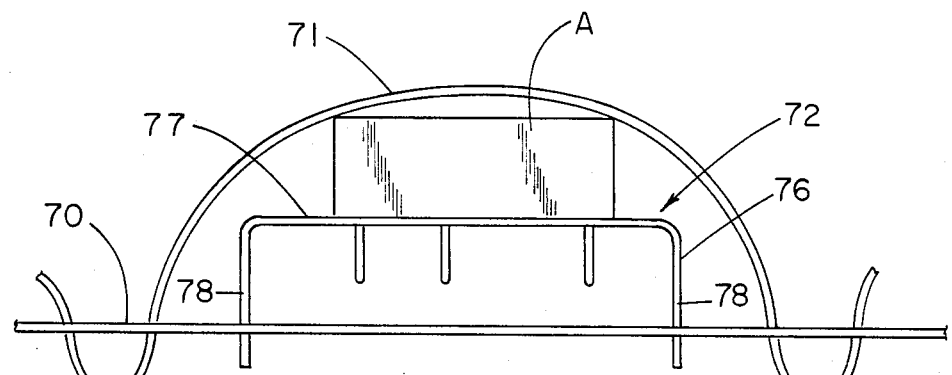
FIG. 17 is a fragmentary side elevational view on an enlarged scale of the primary package shown in FIG. 16.

Accordingly, to provide additional protection with respect to the electrodes of components that are susceptible to electrical damage, a further modified packaging system embodying this invention is provided and is shown in FIGS. 16 and 17. This modified packaging system incorporates the same basic components of the FIG. 1 embodiment and includes a carrier tape 70 and a bonding tape 71. This modified packaging system also includes article locating means 72 which are located in longitudinally aligned relationship along the carrier tape. The carrier tape 70 is also provided with attachment apertures 73 which are formed (at opposite sides of each) locating means 72 and are adapted to mechanically interengage in the same manner as described with respect to FIG. 1 with the bonding tape which is also provided with the pairs of notches 74. It is also advantageous to provide indexing apertures 75 formed along each longitudinal marginal edge portion of the carrier tape to assure positive positioning of the articles that are carried by this packaging system with respect to any utilization apparatus or mechanism.

In this embodiment of the packaging system shown in FIGS. 16 and 17, the article locating means 72 includes a nesting fixture which is formed as a separate element and is assembled with the carrier tape 70. Each nesting fixture 76 may also be formed from a suitable synthetic resin material and may be advantageously molded or stamped and formed into a preformed configuration. This configuration of the nesting fixture is channel-shaped such that the fixture includes a flat support platform 77 and a respective connector flange 78 at each of opposite sides of the support platform with the fixture being oriented on the carrier tape with the longitudinal axis of the channel extending transversely to the carrier tape. These connector flanges 78 are adapted to mechanically interengage with the carrier tape 70 to support the platform 77 in spaced relationship to the one surface of the carrier tape. Mechanical interconnection of the flanges 78 with the carrier tape 70 in this illustrative embodiment is effected by a mechanical interlock that includes a T-shaped lock 79 formed in the carrier tape and cooperatively engageable with each respective connector flange 78. Each of the slots 79 includes a central section 80 and two end sections 81. The two end sections 81 are relatively narrower than the central section and extend in axial alignment with one of the longer sides of the central section. Each of the end sections 81 is of a width that is greater than the thickness of the respective connector flange 78 and has a total length such that the flanges can be inserted through the slot. Formed in each of the connector flanges 78 are a pair of notches 82 that extend longitudinally with respect to the channel axis of the fixture with each notch opening at an end of the fixture. It will be noted that the spacing between the inner ends of the notches 82 is less than the length of the central section 80 of the slot 79 so that the flange will interfit into the central section with end portions of the flange overlying adjacent portions of the carrier tape. These notches are of a width that is slightly greater than the thickness of the carrier tape and thus when the connector flange 78 is inserted into the narrow portion of the slot, it can then be displaced laterally such that respective portions of the carrier tape will extend into the notches 82 and the central portion of the connector flange will enter the central section 80 of the slot. When thus interposed, the carrier tape and connector flange will be mechanically interlocked. It will be noted that the T-shaped slots 79 are arranged in spaced pairs, but oppositely directed to cooperatively receive the respective pairs of connector flanges 78.

The nesting fixtures 76 are dimensionally configured such that the width or spacing between the connector flanges 78 is essentially equal to the spacing of the widest spacing of each pair of the slots 79 at their central sections. Deforming the fixture by bending the connector flanges slightly inward with respect to each other to an extent that the flanges are spaced apart the same distance as the end sections 81 of the slots enables the connector flanges to be inserted into the slots. When the flanges 78 are projected into the slots so that the notches 82 in the fixture flanges are aligned with the carrier tape, release of the inward bending force previously applied to the flanges 78 will then result in the flanges springing outwardly into locking engagement with the carrier tape. Subsequent to assembly of the nesting fixtures 76 with the carrier tape 70, the articles or components A to be packaged may then be positioned on respective ones of the fixtures. The illustrative embodiment is designed to be utilized with electrical components or articles that are also provided with pin-type electrodes or leads as in the case of the previously described embodiments of the invention. Accordingly, platform 77 of each fixture is advantageously formed with a number of small apertures 83 that are again formed in a grid pattern to enhance the versatility and adaptability of a fixture to a number of different lead configurations of various types of components. The vertical height of the platform 77 relative to the carrier tape is determined by the connector flanges 78 and the location of the notches 82 formed therein. As can be seen in FIG. 17, this height or spacing is greater than the length of the leads or connector pins C so that they will not be in contacting engagement with the carrier tape. This construction thus results in an assembly wherein the component leads are provided greater protection as to mechanical damage and also forms an effective shield for electrical protection.

It will be noted that the nesting fixtures 76 are positioned on the carrier tape 70 with the longitudinal axis of each channel-form fixture disposed transversely to the longitudinal axis of the tape. This orientation of the fixtures has an advantage over an orientation wherein the longitudinal axis of the fixtures extends longitudinally relative to the tape in that the flexibility of the packaging system is not reduced to any significant degree. While the carrier tape 70 will have essentially the same degree of flexibility as in the previously described embodiments, the nesting fixtures 76 may nevertheless be relatively rigid and thus provide a fixed support base for the articles. Once the articles A are positioned on the respective nesting fixtures 76, the bonding tape 71 may be applied in the same manner as described with respect to the FIG. 1 embodiment. The bonding tape not only secures the articles A onto respective nesting fixtures, but the bonding tape will also provide additional support and protection for the articles as a consequence of the loops that are formed on the opposite side of the carrier tape at each of the points of attachment.

Figure 18:
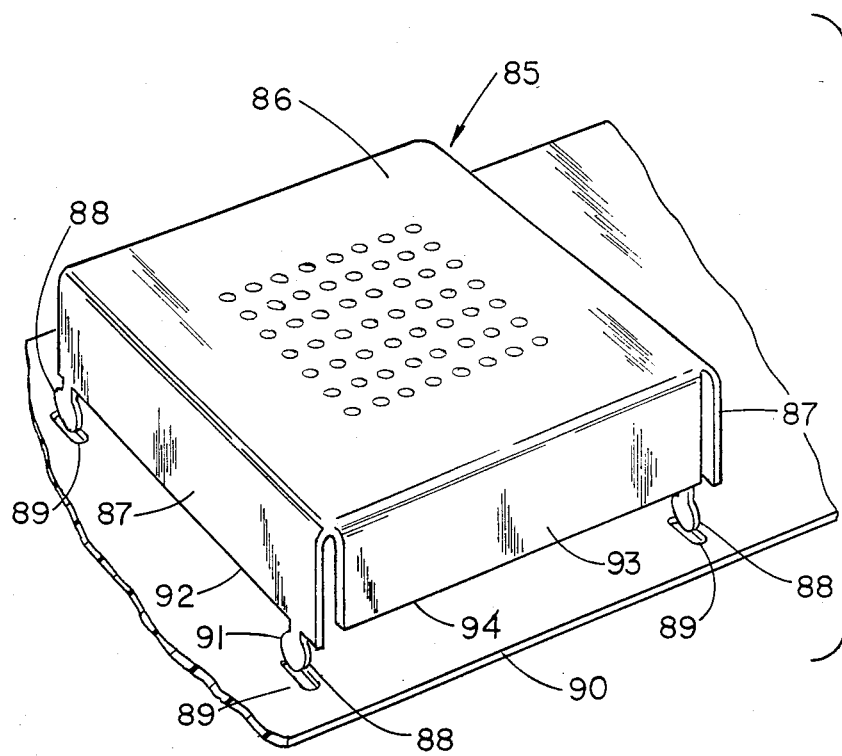
FIG. 18 is a perspective view of a nesting fixture of modified construction for the primary package shown in FIG. 16.

A modified nesting fixture 85 that can be utilized in the packaging system of FIGS. 16 and 17 is illustrated in FIG. 18. This modified nesting fixture 85 incorporates substantially the same construction as that shown in FIG. 16 and is made into a preformed configuration from a suitable plastic material to exhibit a requisite degree of structural rigidity. That configuration includes a flat support platform 86 and a pair of connector flanges 87. These connector flanges 87 are formed along respective sides of the support platform 86 and are provided with four locator tabs 88 that mechanically interlock in respective locating apertures 89 formed in the carrier tape 90. Each of the locator tabs 88 is formed as a downwardly projecting barb at a respective corner of the connector flanges 87 and has upwardly facing barb surfaces 91 which, in cooperation with the bottom edge 92 of the connector flange, define notches that are of a width to receive the carrier tape. For better illustrating the structure, the fixture 85 is shown positioned separate from the carrier but aligned with the locating apertures. Assembly is readily effected by inserting the tabs 88 into respective apertures and forcing the barbs through the aperture which is of a lesser dimension resulting in the barbs locking onto the opposite surface of the carrier tape and the connector flanges 87 in engagement with the upper surface of the carrier tape. The central portion of the platform 86 is also advantageously provided with a number of small apertures 86a arranged in a grid pattern for receiving the pin-type electrodes of an article or component to be packaged. This nesting fixture 85 thus forms a means of accurately locating the packaged articles with respect to the carrier tape.

In this FIG. 18 modified embodiment of the nesting fixture, additional protection as to both mechanical and electrical damage is achieved by providing end flanges 93 at each of the opposite ends of the fixture. Each flange 89 is integrally formed with the platform 86 and projects in a relatively downward direction with the flanges being of a vertical height that is substantially equal to the height at which the platform is supported with respect to the surface of the carrier tape. With this construction, the nesting fixture 85 provides a substantially closed chamber in which the electrodes are contained and thus enhances the mechanical and electrical protection. Additionally, forming the end flanges 93 as described and illustrated does not affect the flexibility of the carrier tape since those flanges are preferably of a vertical height such that their bottom edge 94 is spaced a slight distance from the surface of the carrier tape when assembled with the carrier tape when that carrier tape is in a straight line configuation.

Figure 19:
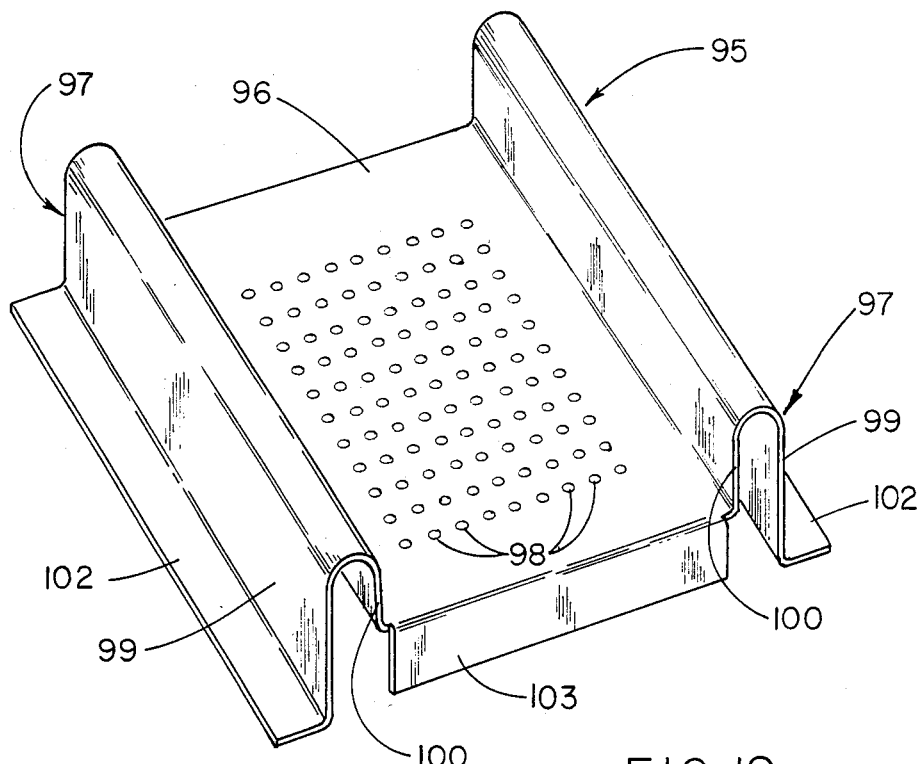
FIG. 19 is a perspective view of another modified nesting fixture.
Figure 20:
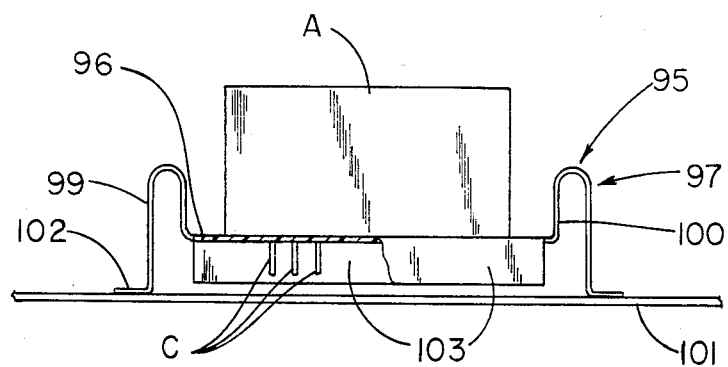
FIG. 20 is a fragmentary side elevational view of a primary package provided with the nesting fixture shown in FIG. 19 with a portion thereof broken away for clarity of illustration and having an article shown positioned thereon.

Another modified nesting fixture 95 is shown in FIGS. 19 and 20. This nesting fixture 95 also includes a flat support platform 96 and a pair of connector flanges 97. A number of small apertures 98 are formed in a grid pattern in the support platform 96 for receiving electrodes of articles to be supported on the fixture. Each of the connector flanges 97 includes an outer leg 99 which is vertically disposed with respect to the platform 96 and is interconnected with the platform through an inner leg 100. The inner leg 100 is of a lesser vertical extent than the outer leg 99 resulting in the platform 96 being suspended a distance above the surface of the carrier tape on which the fixture is positioned. While the outer leg 99 may be formed with notches for mechanical interconnection with the carrier tape as is the case with the fixture shown in FIGS. 16, 17 and 18, this modified form is shown as being designed to be secured to the carrier tape 101 by adhesives or by other appropriate bonding techniques. For this purpose, a relatively narrow attachment plate 102 is integrally formed with the outer leg 99 at its bottom and projects laterally outward with respect thereto to overlie the carrier tape as can be best seen in FIG. 20. A suitable adhesive is used for securing the attachment plates 102 to the carrier tape 101 or the attachment may be effected by heat sealing techniques in the case of fabricating the fixture from a suitable synthetic resin material.

Constructing the FIGS. 19 and 20 nesting fixtures 95 with connector flanges having inner legs 100 results in a construction that provides protection for the article as to mechanical damage as to each of opposed transverse sides of an article. It will be noted in FIG. 20 that the vertical extent of the inner leg 100 is less than the vertical height of article A such that the article may be readily gripped around its upper periphery. Further protection for the electrodes both as to mechanical and electrical damage is provided by end flanges 103 that are integrally formed with the support platform 96 and project in a relatively downward direction. Again, the end flanges 102, one of which is formed at each end of the fixture, has a vertical height that is less than the spacing of the platform with respect to the upper surface of the carrier tape on which it is positioned, such that it will not interfere with the flexing action of the carrier tape, but will provide end protection as to the electrodes. This capability for further end protection as to electrodes can be best seen in FIG. 20 where a portion of the one end flange is shown broken away to illustate the location of the electrodes.

Figure 21:
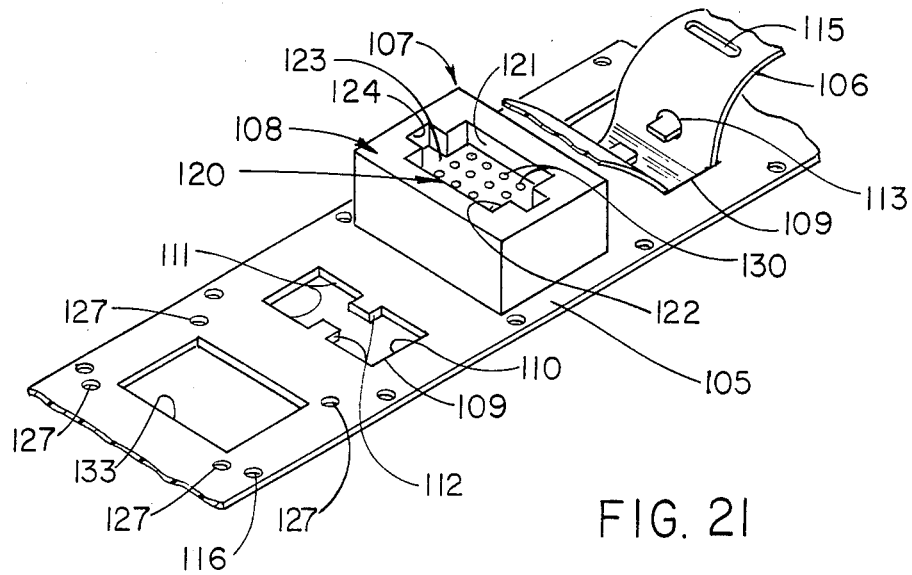
FIG. 21 is a perspective view of another modified nesting fixture.
Figure 22:
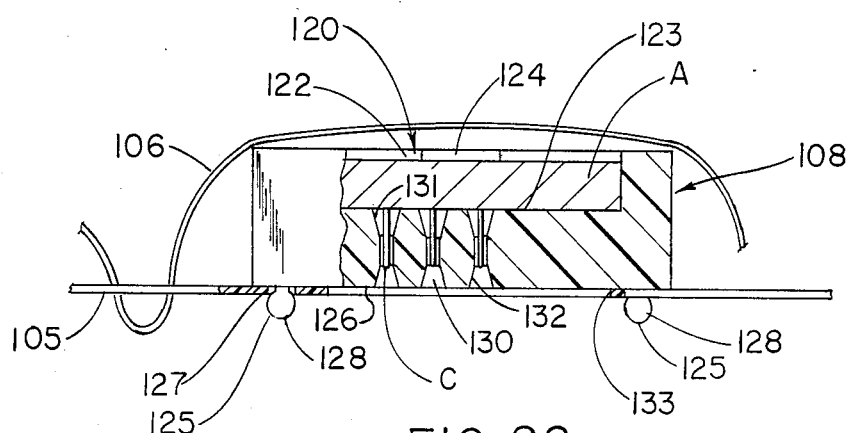
FIG. 22 is a side elevational view of the nesting fixture shown in FIG. 21 mounted on a carrier tape and secured by a bonding tape with portions thereof broken away for illustrating internal construction and means of mechanical interconnection with a carrier tape and positioning of an article thereon.
Figure 23:
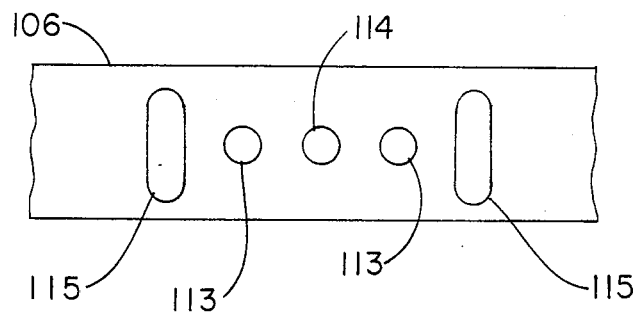
FIG. 23 is a perspective view of a modification of the packaging system of FIG. 1.

Another primary package of modified construction is shown in FIGS. 21, 22 and 23 and comprises the basic components of a carrier tape 105 and a bonding tape 106 designed to cooperatively interengage in securing of articles A in packaged relationships. A typical article A is only shown in FIG. 22 to facilitate illustration of structures. The carrier tape includes article locating means 107 which is of the nesting fixture type with the fixtures 108 being fabricated as separate components and assembled with the carrier tape through mechanical interconnection. Formed in the carrier tape 105 are attachment apertures 109 with one of these apertures being formed at opposite sides of each article locating means 107. Each aperture 109 is of a rectangular shape having end edges 110 spaced apart transversely of the carrier tape a distance sufficient to permit passage of the bonding tape through the aperture. Formed at substantially the midpoint of each of the aperture's transverse edges 111 is a short finger 112 projecting into the aperture. As can be best seen in FIG. 23, the bonding tape 106 is provided with connecting means in the form of pairs of circular apertures 113 that are relatively spaced longitudinally of the tape. Each of the circular apertures 113 is of a size to receive a respective one of the short fingers 112. In a manner similar to the package of FIG. 1, the bonding tape 106 in this modified package is assembled with the carrier tape 105 by forming loops that are projected through the attachment apertures 109 of the carrier tape and overlying the aricles A positioned in respective nesting fixtures 108. The pairs of circular apertures 113 are spaced apart a distance such that when the bonding tape is projected through the apertures 109, a loop of predetermined size is formed and the resilience of the tape will cause the associated portions of the bonding tape to diverge into engagement with the fingers 112 that project through respective apertures 113 and thereby mechanically interlock the bonding and carrier tapes together. To facilitate assembly of the two tapes, another circular aperture 14 is formed intermediate the apertures 113 of each pair that interlock with the fingers 112. This third aperture 114 is designed to cooperate with the pin P of an insertion tool T as described with respect to the FIG. 1 embodiment. Elongated slots 115 may be formed in the bonding tape 106 between adjacent sets of the pairs of apertures 113 to effect a compensating of the resilient forces to assure that the bonding and carrier tapes remain interlocked. A series of longitudinally spaced indexing apertures 116 are also formed along each longitudinal edge portion of the carrier tape.

Each of the nesting fixtures 108 is fabricated as a solid block of material having a cavity 120 formed therein to receive an article in retained relationship. In this illustrative embodiment of the nesting fixture 108, the cavity has a peripheral wall including transverse side walls 121 and longitudinally extending end walls 122 dimensioned to frictionally interengage with respective side walls of the article A which has the same rectangular shape in plan view as the cavity. The cavity is of a depth to fully receive the article and has a bottom wall 123 forming a flat support platform for the article. Transversely opposed recesses 124 are formed in the fixture along each end wall 122 and open to the cavity's interior. These recesses 124 provide access for fingers of an automated gripping mechanism in either insertion of an article or removal of an article from the cavity. These fixtures may be molded from a suitable plastic material which may be a rigid solid or it may be a cellular material for purposes of providing protection as to forces which could crush fragile components as contrasted to a rigid solid.

Attachment of the nesting fixtures 108 to the carrier tape 105 may be effected by the illustrated pin and socket-type mechanical interconnection. Four pins 125 are integrally formed with the main body of the fixture with these pins disposed in respective corners and projecting downwardly from the fixtures' bottom surface 126. Formed in the carrier tape 105 are four sockets 127 which are located to cooperatively receive respective ones of the pins 125. Each of the pins 125 is formed with an enlarged terminal end 128 dimensioned to produce an interference, snap-type fit with a respective socket 127. These enlarged terminal ends 128 are spaced relative to the fixtures' bottom surface 126 to effectively clamp the carrier tape and are advantageously configured to fix the fixture in proper alignment with the tape's indexing apertures 116 for precise location of the articles packaged therewith.

The illustrative article A is provided with a number of pin type connectors or electrodes C which project downwardly from the article's bottom surface. To accommodate those electrodes and provide protection for them, the nesting fixture 108 has a number of holes 130 formed in the portion of the fixture's body within the area defined by the cavity's bottom wall 123. These holes 130 are vertically oriented, opening at both ends and are of a size to receive respective electrodes C with the depth of the fixture, or length of the holes, being greater than the length of the electrodes. As in the previously described embodiments of the primary package, these holes may be formed in a grid-type configuration for versatility in accepting articles with different electrode pin arrangements. Each of the holes 130 is advantageously formed with tapered end portions 131 and 132 which converge inwardly of the fixture's body from each respective end. This tapered configuration facilitates insertion of an article in the fixture's cavity as the upper tapered end portions 131 guide entry of the electrodes into the holes. It is often necessary to perform testing operations on the packaged articles and entry of test probes (not shown) into the holes to engage respective electrodes is also facilitated by the tapered configuration. To permit testing of the articles while they remain packaged, an access window 133 is provided in the carrier tape 105. This window is shown as being of the same area size as the bottom wall 123 of the cavity to provide access to the entire set of holes 130.

The nesting fixture 108 illustrated in FIGS. 21 and 22 has a cavity 120 formed therein to provide a locating function as well as physical protection. Where physical protection of that extent is not required for a particular article, or the article is not adapted to interfitting engagement in a cavity, but is provided with connector pins or electrodes C, the electrodes may then be utilized in performing a locating function. In such a modification of this nesting fixture, there would merely be a block form structure with the article being positioned on the upper surface which could be equivalent to the bottom wall 123 of the cavity 120 in the illustrated form. The holes 130 would also be of the same tapered configuration, but their minimum diameter would be commensurate with the diameter of the electrodes so as to be capable of performing the locating function with the requisite degree of precision. It will be understood that where the depth of the fixture is such that the electrodes exend only partially through the holes, the minimum diameter would occur in the region of the electrodes.

While the illustrative embodiment of the nesting fixture 108 is shown provided with a pin and socket type interconnection with the carrier tape 105, other fastening or attachment techniques may be utilized. For example, the nesting fixture may be adhesively secured to the carrier tape.

While some of the nesting fixtures illustrated in various embodiments of the primary package incorporate structures which do not significantly interfere with flexing of the carrier tapes such as in coiling of lengths of the primary package into a secondary package, such flexing capability is not an absolute requirement. Flexing capability is an advantageous feature for packaging of some components or articles, but it is not essential that flexing capability be retained throughout the carrier tape in its entirety. Reduced flexing capability is evidenced in the primary package shown in FIGS. 21, 22 and 23 in view of the nesting fixture 108 being positioned in contacting engagement with the carrier tape throughout its entire extent, thus inherently resulting in rigidification of the carrier tape underlying the nesting fixture. However, this rigidification of the carrier tape in longitudinally spaced areas does not prevent coiling of the primary package or its movement in association with mechanisms that perform various functions with respect to the package or articles packaged therewith. The package may be coiled or displaced along arcuate paths even though sections of the carrier tape remain straight since the sections of the carrier tape intermediate any two adjacent nesting fixtures will provide adequate flexibility for the package.

It was previously pointed out that the primary package provided by this invention could be designed to package articles other than electrical components having electrically conductive electrodes. Just as the strip-form carrier tape could be designed to package articles having only mechanical function or structure, the carrier tapes including nesting fixtures may also be designed and configured to package similar articles having only mechainal function or structure. Design of specific carrier tape or nesting fixture structures for particular articles is deemed within the capabilities of the artisan skilled in this field and disclosure of other specific structures for performing the article locating function are not believed necessary for enabling one to practice this invention.

Each of the several embodiments of the primary package of this invention have been described primarily as being designed for utilization with articles such as electrical components having electrical contacts. Furthermore, most of these exemplary embodiments illustrated electrical contacts described as pin-type electrodes of circular cross-section that were inserted into circular apertures formed in the carrier tape or nesting fixtures forming a part of the carrier tape. However, the electrodes of many solid state electrical components are of a flat bar shape having a rectangular cross-section. Consequently, it may be advantageous, if not necessary, to form the apertures or holes in the carrier tape or nesting fixtures with rectangular cross-section of commensurate dimension to receive the electrodes and properly perform the article locating function with the requisite degree of precision.

In describing the several illustrative primary packages embodying this invention, the carrier and bonding tapes were generally described as being fabricated from synthetic resin or plastic materials exhibiting the requisite structural strength and flexible characteristic as well as having resilience. In some of the embodiments, the bonding tape is preferably formed from a material that exhibits a degree of resilience as it is that tape's resilience which maintains it in interlocked engagement with the carrier tape. However, it is not essential that the carrier tape in those embodiments exhibit any particular degree of resilience. It is sufficient that the carrier tape exhibit sufficient structural strength to enable it to resist resilient forces exerted upon it by the bonding tape. Also, materials other than synthetic resins may be utilized in fabrication of either or both carrier and bonding tapes such, as for example, metal or paperboard.

The several embodiments of the primary package have each been illustrated and described as having a single article locating means interposed between any two adjacent points of interengagement of the bonding tape with the carrier tape. However, this basic configuration is not to be considered limitative as to the practice of this invention. Just as more than one article may be disposed in engagement with any one locating means depending upon the relative sizes of the articles and the locating means, more than one locating means may be provided between any two adjacent points of interengagement of the bonding and carrier tapes. Not only may two or more locating means be provided in transversely extending rows in underlying relationship to a single loop of a bonding tape, but two or more article locating means may be provided in longitudinal alignment underlying a single loop of the bonding tape.

It will be readily apparent from the foregoing description of the several illustrated embodiments of the invention that a novel packaging system has been provided for fulfilling the requirement of fully automated component and article handling systems. The primary packaging in any of its several disclosed embodiments performs a basic packaging function and, more importantly, performs a packaging function in which each of the packaged articles is precisely positioned in predetermined orientation to the package so that they can be readily handled and operated upon by automated machine mechanisms throughout a manufacturing process which includes not only the ultimate utilization of an article, but also includes initial packaging of the article or any number of intermediate testing, transport, storage or other functions. The primary package provided by this invention is also readily capable of modification to accommodate variously configured articles while retaining the ability to implement the concepts of this invention.

Having thus described this invention, what is claimed is:

1. An article packaging system for a plurality of articles disposed seriatim in predetermined relationship including a primary package comprising
    (A) a carrier tape of elongated strip form having a plurality of article locating means disposed seriatim along a longitudinal axis of said tape in spaced relationship on a surface thereof, each of said article locating means adapted to cooperatively engage with at least one article to releasably position that article in a predetermined location and orientation with respect to said tape,
    (b) article bonding means for maintaining articles on said carrier tape in association with respective article locating means, said bonding means including a flexible article bonding tape of elongated strip form disposed in longitudinally extending relationship to said carrier tape and overlying articles positioned in engagement with respective ones of said article locating means, and
    (C) interengaging means for releasably interconnecting said bonding tape with said carrier tape at selected points spaced longitudinally of said carrier tape at opposite sides of said article locating means whereby articles positioned in engagement with respective article locating means will be retained in packaged relationship, said interengaging means including a plurality of apertures formed in said carrier tape with an aperture disposed at each of said selected points, said bonding tape formed into a loop at each point of interconnection with said carrier tape with each loop projected through a respective aperture and extending a predetermined distance from the carrier tape.

2. An article packaging system according to claim 1 wherein said interengaging means includes cooperatively interfitting sockets and projections that mechanically interlock.

3. An article packaging system according to claim 2 wherein slot-form apertures are formed in said carrier tape and dimensioned to enable projections of a loop of said bonding tape to project therethrough, said carrier tape having a pair of opposing projections formed in said slot and said bonding tape having a pair of sockets formed therein in longitudinally spaced relationship to receive respective ones of said slot projections.

4. An article packaging system according to claim 1 wherein said carrier tape is formed with an aperture through which a loop of said bonding tape may be projected, said aperture in said carrier tape having spaced edges extending transversely across said carrier tape with each edge provided with a notch, said bonding tape having at least one pair of longitudinally spaced slots opening at a longitudinal edge forming sockets to receive the carrier tape, said notches and slots relatively dimensioned to permit interfitting of the carrier and bonding tapes in mechanically interlocked engagement.

5. An article packaging system according to claim 1 wherein said article locating means are formed in said carrier tape.

6. An article packaging system according to claim 5 wherein each said article locating means includes at least one aperture configured to receive a mating projection on an article disposed in cooperative engagement to position an engaged article at a fixed location on said carrier tape and in a predetermined orientation thereto.

7. An article packaging system according to claim 6 wherein each said article locating means includes a plurality of said apertures that are relatively disposed to each other in a predetermined pattern.

8. An article packaging system according to claim 5 wherein each said locating means includes a plurality of upstanding elements projecting a distance from a surface of said carrier tape and relatively positioned to each other in a predetermined orientation for cooperation engaging with an article around its periphery to position the article at a fixed position on said carrier tape and in a predetermined orientation thereto.

9. An article packaging system according to claim 8 wherein said upstanding elements are integrally formed with said carrier tape.

10. An article packaging system according to claim 8 wherein said upstanding elements are of plate-like form and are disposed on said carrier tape to position an edge thereof into contacting engagement with an article, said plurality of elements relatively disposed so that they cooperatively define an article's peripheral surface.

11. An article packaging system according to claim 10 wherein said upstanding elements are integrally formed with said carrier tape.

12. An article packaging system according to claim 8 wherein said carrier tape is formed with an aperture at an article locating means to provide access to a substantial portion of an article engaged by said article locating means.

13. An article packaging system according to claim 1 wherein each said article locating means includes a nesting fixture which engages with an article.

14. An article packaging system according to claim 13 wherein each said nesting fixture includes an article supporting plate supported in laterally spaced relationship to a surface of said carrier tape and adapted to cooperatively engage with an article disposed thereon to position such article in a fixed location on said carrier tape and in a predetermined orientation relative thereto.

15. An article packaging system according to claim 14 wherein said supporting plate is formed with at least one aperture configured to receive a mating projection on an article disposed in cooperative engagement thereon, said supporting plate disposed a distance from the surface of the carrier tape to prevent the article's projection from contacting said carrier tape.

16. An article packaging system according to claim 15 wherein said article supporting plate is formed with a plurality of said apertures which are relatively disposed in a predetermined pattern.

17. An article packaging system according to claim 14 wherein said nesting fixtures each include a pair of connector flanges formed with said article supporting plate at opposite sides thereof, said connector flanges disposed in laterally projecting relationship to said supporting plate and extending into connecting engagement with said carrier tape.

18. An article packaging system according to claim 17 wherein said connector flanges are disposed in transversely extending relationship to said carrier tape.

19. An article packaging system according to claim 17 wherein said nesting fixtures are formed as an element separate from said carrier tape, said connector flanges adapted to interconnect with said carrier tape for maintaining of the fixture in fixed association with said carrier tape.

20. An article packaging system according to claim 19 wherein said connector flange and said carrier tape are provided with means for mechanically interlocking the fixtures and tape together.

21. An article packaging system according to claim 19 wherein said connector flanges and said carrier tape are formed with cooperatively interlocking slots for interconnecting the fixtures and tape together.

22. An article packaging system according to claim 19 wherein said connector flanges are formed with projections and said carrier tape is formed with sockets that cooperatively interfit in mechanically interlocked relationship.

23. An article packaging system according to claim 19 wherein said connector flanges are each formed with a laterally projecting plate adapted to be disposed in overlying contacting engagement with said carrier tape and to be secured thereto.

24. An article packaging system according to claim 13 wherein each of said nesting fixtures is formed as a block of material adapted to be secured to said carrier tape in fixed relationship thereto, said fixture having an article support surface disposed in spaced relationship to said carrier tape and on which an article is adapted to be supported and having at least one hole formed therein in perpendicular relationship to the article support surface for receiving a projection formed on a supported article, the spacing of said article support surface being at least equal to the length of an article's projection received in said hole.

25. An article packaging system according to claim 24 wherein said nesting fixture is formed with a plurality of said holes which are relatively disposed to each other in a predetermined pattern and cooperatively receive a plurality of projections on an article to position the article in fixed location on said carrier tape and in predetermined orientation thereto.

26. An article packaging system according to claim 24 wherein said nesting fixture is provided with wall-forming elements projecting in upstanding relationship to said article support surface, said wall forming elements disposed to contactingly engage with an article and relatively disposed to each other to cooperatively position the article in fixed location on said carrier tape and in predetermined orientation thereto.

27. An article packaging system according to claim 24 wherein said carrier tape is formed with an aperture at an article locating means to provide access to the projection of an article.

28. An article packaging system according to claim 1 which includes a secondary package of box-like form into which a length of said primary package is adapted to be disposed, said length of primary package being spirally coiled in retained relationship in said secondary package.

29. An article packaging system according to claim 28 which includes a barrier strip disposed in longitudinally aligned relationship to said primary package and adapted to be spirally coiled therewith, said barrier strip being of a width substantially equal in width to that of said primary package and of a length so as to be interleaved between each coil thereof on which articles are packaged.

30. An article packaging system according to claim 29 wherein said barrier strip is formed from a material that is substantially incompressible.

31. An article packaging system according to claim 29 wherein said barrier strip is formed from a material that is resiliently compressible.

32. An article packaging system according to claim 28 wherein said primary package exhibits a characteristic resilience whereby said primary package tends to maintain a predetermined configuration.

33. An article packaging system according to claim 1 wherein said primary package exhibits a characteristic resilience whereby said primary package tends to maintain a predetermined configuration.

34. An article packaging system according to claim 33 wherein said carrier tape is formed from a material that exhibits a predetermined degree of resilience.

35. An article packaging system according to claim 33 wherein said bonding tape is formed from a material that exhibits a predetermined degree of resilience.

36. An article packaging system according to claim 33 wherein each of said carrier and bonding tapes are formed from respective materials that exhibit respective predetermined degrees of resilience.

37. An article packaging system according to claim 1 wherein said primary package includes indexing means correlated to each of said article locating means for enabling selective positioning of said primary package with respect to a reference to locate an article cooperatively engaged with a respective one of said article locating means with respect to that reference, said indexing means including indexing elements disposed in longitudinally spaced relationship along said primary package in predetermined relationship to said article locating means.

38. An article packaging system according to claim 37 wherein said index elements are located on said carrier tape.

39. An article packaging system for a plurality of articles disposed seriatim in predetermined relationship including a primary package comprising
   (A) a carrier tape of elongated strip form having a plurality of article locating means disposed seriatim along a longitudinal axis of said tape in spaced relationship on a surface thereof, each of said article locating means adapted to cooperatively engage with at least one article to releasably position that article in a predetermined location and orientation with respect to said tape,
   (B) article bonding means for maintaining articles on said carrier tape in association with respective article locating means, said bonding means including a flexible article bonding tape of elongated strip form disposed in longitudinally extending relationship to said carrier tape and overlying articles positioned in engagement with respective ones of said article locating means, and (C) interengaging means including cooperatively interfitting sockets and projections that mechanically interlock for releasably interconnecting said bonding tape with said carrier tape at selected points spaced longitudinally of said carrier tape at opposite sides of said article locating means whereby articles positioned in engagement with respective article locating means will be retained in packaged relationship, said carrier tape having a plurality of slot-form apertures formed therein in longitudinally spaced relationship and dimensioned to enable projection of a loop of said bonding tape through each respective aperture, said carrier tape having a pair of the projections formed in each of said slot form apertures in opposing relationship to each other, said bonding tape having pairs of the sockets formed therein in longitudinally spaced relationship with the sockets of each pair being disposed in longitudinally spaced relationship to each other and configured to receive respective ones of said projections in an aperture.

40. An article packaging system for a plurality of articles disposed seriatim in predetermined relationship including a primary package comprising (A) a carrier tape of elongated strip form having a plurality of article locating means disposed seriatim along a longitudinal axis of said tape in spaced relationship on a surface thereof, each of said article locating means adapted to cooperatively engage with at least one article to releasably position that article in a predetermined location and orientation with respect to said tape, (B) article bonding means for maintaining articles on said carrier tape in association with respective article locating means, said bonding means including a flexible article bonding tape of elongated strip form disposed in longitudinally extending relationship to said carrier tape and overlying articles positioned in engagement with respective ones of said article locating means, and (C) interengaging means including cooperatively interfitting notches and sockets formed in said carrier and bonding tapes for releasably interconnecting said bonding tape with said carrier tape at selected points spaced longitudinally of said carrier tape at opposite sides of said article locating means whereby articles positioned in engagement with respective article locating means will be retained in packaged relationship, said carrier tape having a plurality of apertures formed therein in longitudinally spaced relationship and through each of which apertures respective loops of said bonding tape may be projected, each of said apertures in said carrier tape having spaced apart edges extending transversely across said carrier tape with each edge provided with a notch, said bonding tape having pairs of slots disposed in longitudinally spaced relationship with the slots in each pair disposed in longitudinally spaced relationship to each other and opening at a longitudinal edge of said bonding tape forming sockets to receive the carrier tape, said notches and slots relatively dimensioned to permit cooperative interfitting of the carrier and bonding tapes in mechanically interlocked engagement.

* * * * *